United States Patent [19]

Copeland, III

[11] Patent Number: 4,862,167
[45] Date of Patent: Aug. 29, 1989

[54] ADAPTIVE DATA COMPRESSION METHOD AND APPARATUS

[75] Inventor: John A. Copeland, III, Dunwoody, Ga.

[73] Assignee: Hayes Microcomputer Products, Inc., Norcross, Ga.

[21] Appl. No.: 18,340

[22] Filed: Feb. 24, 1987

[51] Int. Cl.⁴ .............................................. H03M 7/40
[52] U.S. Cl. ...................................... 341/107; 341/106
[58] Field of Search ................... 341/87, 95, 106, 107, 341/67

[56] References Cited

U.S. PATENT DOCUMENTS

| | | | |
|---|---|---|---|
| 4,464,650 | 8/1984 | Eastman et al. | 341/51 |
| 4,586,027 | 4/1986 | Tsukiyama et al. | 340/347 DD |
| 4,612,532 | 9/1986 | Bacon et al. | 340/347 DD |
| 4,748,638 | 5/1988 | Friedman et al. | 340/347 DD |

FOREIGN PATENT DOCUMENTS

| | | |
|---|---|---|
| 0155980 | 10/1985 | European Pat. Off. |
| WO86/00479 | 1/1986 | PCT Int'l Appl. |
| WO86/05339 | 9/1986 | PCT Int'l Appl. |

OTHER PUBLICATIONS

*Data Compression*, Table of Contents, 1983, Gilbert Held.
*Data Compression*, Table of Contents, pp. 63-67, pp. 302-305, 1985, Thomas J. Lynch.
Bentley et al., "A Locally Adaptive Data Compression Scheme", Communications of the ACM, vol. 29, No. 4 (Apr. 1986), pp. 320-330.

*Primary Examiner*—William M. Shoop, Jr.
*Assistant Examiner*—Marc S. Hoff
*Attorney, Agent, or Firm*—Jones, Askew & Lunsford

[57] ABSTRACT

A method and apparatus for compressing data, particularly useful in a modem. The preferred method is implemented in a microprocessor within a modem, and dynamically adapts to changing data statistics. Parallel encoding and decoding tables are provided at the encoder and the decoder, and are updated for each character processed. Each table has a plurality of digital compression codes associated with characters of an alphabet. In response to an item of data presented for encoding, a compression code which corresponds to the character presented for encoding is selected using the encoding table. The selected compression code is provided as an output. Periodically, the association between the codes and the characters of the alphabet in the table is adjusted as a function of the frequency of occurrence of characters of the alphabet, over a plurality of characters. As the frequency of occurrence of characters presented for encoding changes, the more frequently occurring characters become associated with the shorter codes in the encoding table. By performing the same steps in the decoding table, the compression codes are used at the decoder to select a character of the alphabet, which is provided as a decoded output.

63 Claims, 9 Drawing Sheets

EXEMPLARY DATA STREAM:

The Hayes Compression algorithm works on the principle of data frequency statistics. These statistics are accumulated on the fly, eliminating the need to pre-scan the data to determine its characteristics. Data that occurs more frequently is represented in fewer bits than data that occurs less frequently.

FIG. 3

Initial encoding level: $a$ = 4 characters, encoded with $p$ bits ($p$ = 4)

Initial Condition of Table T1

Encoded with $q$ bits: $b = 256 - a - c$ characters ($q = 8$)

Encoded with $r$ bits: $c = 16a$ characters ($r = 12$)

FIG. 4

Table T1 after first character

Characters of alphabet — Character Count ($\alpha$)

EXEMPLARY DATA STREAM:

The Hayes Compression algorithm works on the principle of data frequency statistics. These statistics are accumulated on the fly, eliminating the need to pre-scan the data to determine its characteristics. Data that occurs more frequently is represented in fewer bits than data that occurs less frequently.

FIG. 5

Table T1 after second character

| ^@ | ^P | sp | 0 | @ | P | ` | p | v@ | vP | + | +0 | +@ | +P | +` | +p |
|---|---|---|---|---|---|---|---|---|---|---|---|---|---|---|---|
| ^A | ^Q | ! | 1 | A | Q | a | q | vA | vQ | +! | +1 | +A | +Q | +a | +q |
| ^B | ^R | " | 2 | B | R | b | r | vB | vR | +" | +2 | +B | +R | +b | +r |
| ^C | ^S | # | 3 | C | S | c | s | vC | vS | +# | +3 | +C | +S | +c | +s |
| ^D | ^T | $ | 4 | T | 1 D | 0 d | t | vD | vT | +$ | +4 | +D | +T | +d | +t |
| ^E | ^U | % | 5 | E | U | e | u | vE | vU | +% | +5 | +E | +U | +e | +u |
| ^F | ^V | & | 6 | F | V | f | v | vF | vV | +& | +6 | +F | +V | +f | +v |
| ^G | ^W | ' | 7 | G | W | g | w | vG | vW | +' | +7 | +G | +W | +g | +w |
| ^H | ^X | ( | 8 | H | h | 1 W | 0 x | vH | vX | +( | +8 | +H | +X | +h | +x |
| ^I | ^Y | ) | 9 | I | Y | i | y | vI | vY | +) | +9 | +I | +Y | +i | +y |
| ^J | ^Z | * | : | J | Z | j | z | vJ | vZ | +* | +: | +J | +Z | +j | +z |
| ^K | ^[ | + | ; | K | [ | k | { | vK | v[ | ++ | +; | +K | +[ | +k | +{ |
| ^L | ^\ | , | < | L | \ | l | \| | vL | v\ | +, | +< | +L | +\ | +l | +\| |
| ^M | ^] | - | = | M | ] | m | } | vM | v] | +- | += | +M | +] | +m | +} |
| ^N | ^^ | . | > | N | ^ | n | ~ | vN | v^ | +. | +> | +N | +^ | +n | +~ |
| ^O | ^_ | / | ? | O | _ | o | ro | vO | v_ | +/ | +? | +O | +_ | +o | +` |

FIG. 6

Table T1 after third character

| ^@ | ^P | sp | 0 | @ | P | ` | p | v@ | vP | + | +0 | +@ | +P | +` | +p |
|---|---|---|---|---|---|---|---|---|---|---|---|---|---|---|---|
| ^A | ^Q | ! | 1 | A | Q | a | q | vA | vQ | +! | +1 | +A | +Q | +a | +q |
| ^B | ^R | " | 2 | B | R | b | r | vB | vR | +" | +2 | +B | +R | +b | +r |
| ^C | ^S | # | 3 | C | S | c | s | vC | vS | +# | +3 | +C | +S | +c | +s |
| ^D | ^T | $ | 4 | T | 1 D | 0 d | t | vD | vT | +$ | +4 | +D | +T | +d | +t |
| ^E | ^U | % | 5 | E | e | 1 U | 0 u | vE | vU | +% | +5 | +E | +U | +e | +u |
| ^F | ^V | & | 6 | F | V | f | v | vF | vV | +& | +6 | +F | +V | +f | +v |
| ^G | ^W | ' | 7 | G | W | g | w | vG | vW | +' | +7 | +G | +W | +g | +w |
| ^H | ^X | ( | 8 | H | h | 1 W | 0 x | vH | vX | +( | +8 | +H | +X | +h | +x |
| ^I | ^Y | ) | 9 | I | Y | i | y | vI | vY | +) | +9 | +I | +Y | +i | +y |
| ^J | ^Z | * | : | J | Z | j | z | vJ | vZ | +* | +: | +J | +Z | +j | +z |
| ^K | ^[ | + | ; | K | [ | k | { | vK | v[ | ++ | +; | +K | +[ | +k | +{ |
| ^L | ^\ | , | < | L | \ | l | \| | vL | v\ | +, | +< | +L | +\ | +l | +\| |
| ^M | ^] | - | = | M | ] | m | } | vM | v] | +- | += | +M | +] | +m | +} |
| ^N | ^^ | . | > | N | ^ | n | ~ | vN | v^ | +. | +> | +N | +^ | +n | +~ |
| ^O | ^_ | / | ? | O | _ | o | ro | vO | v_ | +/ | +? | +O | +_ | +o | +` |

EXEMPLARY DATA STREAM:

> The Hayes Compression algorithm works on the principle of data frequency statistics. These statistics are accumulated on the fly, eliminating the need to pre-scan the data to determine its characteristics. Data that occurs more frequently is represented in fewer bits than data that occurs less frequently.

FIG. 7

Table T1 before end of first line

| sp | 9 | ^@ | | ^P | 0 | | p | 3 | @ | | P | ` | | v@ | vP | + | +0 | +@ | +P | +` | +p |
|---|---|---|---|---|---|---|---|---|---|---|---|---|---|---|---|---|---|---|---|---|---|
| ^A | | ^Q | | ! | a | 3 | 1 | | A | | Q | | q | vA | vQ | +! | +1 | +A | +Q | +a | +q |
| ^B | | ^R | | " | r | 4 | 2 | | B | | R | | b | vB | vR | +" | +2 | +B | +R | +b | +r |
| ^C | | ^S | | # | s | 4 | C | 1 | 3 | | c | | S | vC | vS | +# | +3 | +C | +S | +c | +s |
| ^D | | ^T | | $ | 4 | | t | 3 | T | 1 | d | 1 | D | vD | vT | +$ | +4 | +D | +T | +d | +t |
| ^E | | e | 5 | ^U | % | | 5 | | E | | U | | u | vE | vU | +% | +5 | +E | +U | +e | +u |
| ^F | | ^V | | & | 6 | | F | | f | 1 | V | | v | vF | vV | +& | +6 | +F | +V | +f | +v |
| ^G | | ^W | | ' | 7 | | G | | g | 1 | w | 1 | W | vG | vW | +' | +7 | +G | +W | +g | +w |
| ^H | | ^X | | ( | h | 3 | H | 1 | 8 | | X | 0 | x | vH | vX | +( | +8 | +H | +X | +h | +x |
| ^I | | ^Y | | ) | 9 | | I | | Y | | y | 1 | j | vI | vY | +) | +9 | +I | +Y | +i | +y |
| ^J | | ^Z | | * | i | 4 | : | | J | | Z | | z | vJ | vZ | +* | +: | +J | +Z | +j | +z |
| ^K | | ^[ | | + | ; | | K | | k | 1 | [ | | { | vK | v[ | ++ | +; | +K | +[ | +k | +{ |
| ^L | | ^\ | | , | < | | l | 2 | L | | \ | | | | vL | v\ | +, | +< | +L | +\ | +l | +| |
| ^M | | ^] | | - | = | | m | 2 | M | | ] | | } | vM | v] | +- | += | +M | +] | +m | +} |
| ^N | | ^^ | | . | n | 3 | > | | N | | ^ | | ~ | vN | v^ | +. | +> | +N | +^ | +n | +~ |
| o | 6 | ^O | | _ | / | | ? | | O | | _ | | ro | vO | v_ | +/ | +? | +O | +_ | +o | +` |

FIG. 8

Table T1 after end of first line

| sp | 9 | ^@ | | ^P | 0 | | p | 3 | @ | | P | ` | | v@ | vP | + | +0 | +@ | +P | +` | +p |
|---|---|---|---|---|---|---|---|---|---|---|---|---|---|---|---|---|---|---|---|---|---|
| ^A | | ^Q | | a | 4 | ! | 1 | | A | | Q | | q | vA | vQ | +! | +1 | +A | +Q | +a | +q |
| ^B | | ^R | | | r | | 2 | | B | | R | | b | vB | vR | +" | +2 | +B | +R | +b | +r |
| ^C | | ^S | | # | s | 4 | C | 1 | 3 | | c | | S | vC | vS | +# | +3 | +C | +S | +c | +s |
| ^D | | ^T | | $ | 4 | | t | 3 | T | 1 | d | 1 | D | vD | vT | +$ | +4 | +D | +T | +d | +t |
| ^E | | e | 5 | ^U | % | | 5 | | E | | U | | u | vE | vU | +% | +5 | +E | +U | +e | +u |
| ^F | | ^V | | & | 6 | | F | | f | 1 | V | | v | vF | vV | +& | +6 | +F | +V | +f | +v |
| ^G | | ^W | | ' | 7 | | G | | g | 1 | w | 1 | W | vG | vW | +' | +7 | +G | +W | +g | +w |
| ^H | | ^X | | ( | h | 3 | H | 1 | 8 | | X | 0 | x | vH | vX | +( | +8 | +H | +X | +h | +x |
| ^I | | ^Y | | ) | 9 | | I | | Y | | y | 1 | j | vI | vY | +) | +9 | +I | +Y | +i | +y |
| ^J | | ^Z | | * | i | 4 | : | | J | | Z | | z | vJ | vZ | +* | +: | +J | +Z | +j | +z |
| ^K | | ^[ | | + | ; | | K | | k | 1 | [ | | { | vK | v[ | ++ | +; | +K | +[ | +k | +{ |
| ^L | | ^\ | | , | < | | l | 2 | L | | \ | | | | vL | v\ | +, | +< | +L | +\ | +l | +| |
| ^M | | ^] | | - | = | | m | 2 | M | | ] | | } | vM | v] | +- | += | +M | +] | +m | +} |
| ^N | | ^^ | | . | n | 3 | > | | N | | ^ | | ~ | vN | v^ | +. | +> | +N | +^ | +n | +~ |
| o | 6 | ^O | | _ | / | | ? | | O | | _ | | ro | vO | v_ | +/ | +? | +O | +_ | +o | +` |

EXEMPLARY DATA STREAM:

> The Hayes Compression algorithm works on the principle of data frequency statistics. These statistics are accumulated on the fly, eliminating the need to pre-scan the data to determine its characteristics. Data that occurs more frequently is represented in fewer bits than data that occurs less frequently.

Still on initial encoding level: $a$ = 4 characters encoded with $p$ bits ($p$ = 4)

FIG. 9

Table T1 before end of second line

FIG. 10

Table T1 after end of second line

EXEMPLARY DATA STREAM:

> The Hayes Compression algorithm works on the principle of data frequency statistics. These statistics are accumulated on the fly, eliminating the need to pre-scan the data to determine its characteristics. Data that occurs more frequently is represented in fewer bits than data that occurs less frequently.

FIG. 11

Initial encoding level = 4

Table T1 before first level recalculation (after the "y" in "fly" in line 3):

Group (column) counts: 77   23   6   6   11   7   2   0   0

FIG. 12

New encoding level:
$a$ = 8 characters
get $p$ = 4 bits coding

Table T1 after first level recalculation:

$i = 0$   1   2 ...                   ... 13   14   15

Encoded with $q$ bits:   $b = 256 - a - c$
= 120 characters  ($q = 8$)

Encoded with $r$ bits:
$c = 16a$ = 128 characters
($r = 12$)

EXEMPLARY DATA STREAM:

> The Hayes Compression algorithm works on the principle of data frequency statistics. These statistics are accumulated on the fly, eliminating the need to pre-scan the data to determine its characteristics. Data that occurs more frequently is represented in fewer bits than data that occurs less frequently.

FIG. 13
Table T1 before end of third line:

FIG. 14
Table T1 after end of third line:

EXEMPLARY DATA STREAM:

The Hayes Compression algorithm works on the principle of data frequency statistics. These statistics are accumulated on the fly, eliminating the need to pre-scan the data to determine its characteristics. Data that occurs more frequently is represented in fewer bits than data that occurs less frequently.

FIG. 15

Table T1 before second level recalculation (after the "in" on line 5):

Beginning encoding level $a = 8$

New encoding level:
$a$ = 12 characters
get $p$ = 4 bits coding

FIG. 16

Table T1 after second level recalculation:

Encoded with $q$ bits: $b = 256 - a - c$ = 52 characters ($q = 8$)

Encoded with $r$ bits: $c = 16a$ = 192 characters ($r = 12$)

FIG. 17
Repetitive character string compression
FIG. 17A
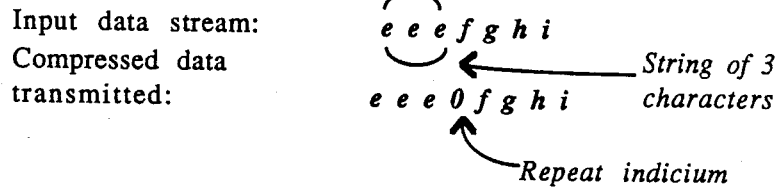
FIG. 17B
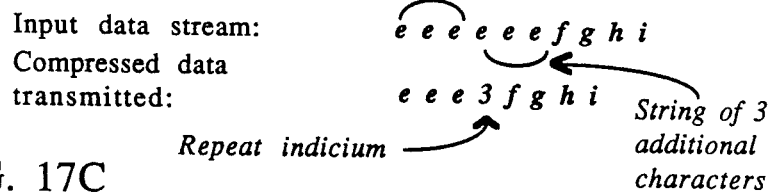
FIG. 17C
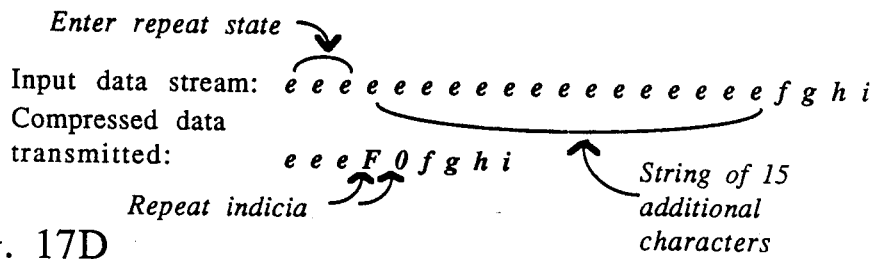
FIG. 17D
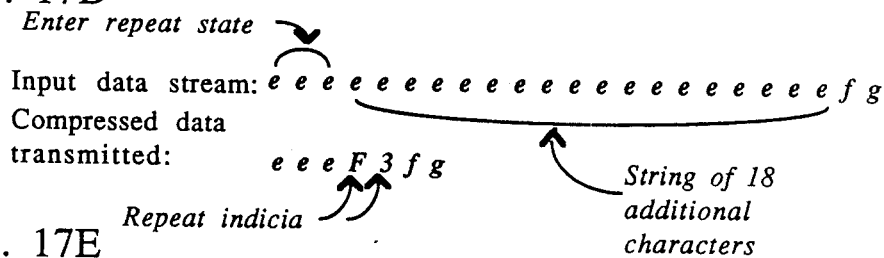
FIG. 17E
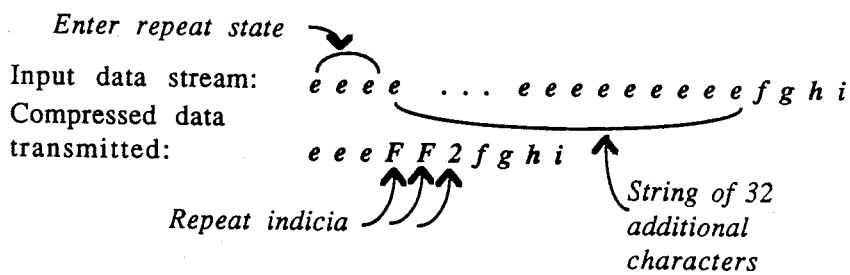

ADAPTIVE DATA COMPRESSION METHOD AND APPARATUS

TECHNICAL FIELD

The present invention relates generally to data compression, and relates more particularly to an adaptive data compression method and apparatus which is operative in real time and dynamically adapts to changing statistics of occurrence of characters in an input information stream.

BACKGROUND OF THE INVENTION

Various schemes and devices for data compression are known in the art. Many known techniques relay upon statistics which relate to the frequency of occurrence of elements or "characters" in a data set. Typically, a set or file of data to be compressed must be prescanned or processed in order to accumulate the statistics of occurrence of the characters in the data set, preparatory to assigning codes for representing the characters. Then, shorter codes are assigned to the more frequently occurring characters and longer codes are assigned to the less frequently occurring characters.

In the well known Shannon-Fano code, an input file to be compressed is analyzed, and the probabilities of occurrence of particular characters are arranged in descending order. The set of characters is then divided into subsets of equal or almost equal total probability, and a zero is assigned as the first code digit in one subset and a one is assigned as the first code digit in the second subset. These steps are repeated until each subset contains only one character. Codes produced by this method are instantaneously decodable since no code word is a prefix or any other code word.

The popular Huffman code also has the property of instantaneous decodability, but employs a coding tree. In this method, which yields a provably minimum average word length, again the source or input data file must be prescanned, and the probabilities of the characters arranged in descending order. The two lowest probabilities are combined and a probability tree is constructed by placing the higher probability branch on top. A zero is assigned to the upper member and a one to the lower member of each pair on the tree. Then, the path from each item's probability is traced to the unity point, recording the one's and zero's along the path. Then, the resultant code is the one-zero sequence obtained. Needless to say, analysis of the entire data set is required before the codes can be assigned.

While these data compression techniques are suitable when there is ample processing time available for prescanning the data, in real time applications such as data communications involving a modulator-demodulator ("modem") it is not always possible or desirable to prescan data and establish the most efficient code. In such applications, the nature of the data may change, rendering a fixed compression scheme inefficient. For example, modems may transmit text files, graphics files, mixed text and graphics, software object code, spreadsheet files, interactive communications with other systems, or other types of data. In order for compression to be effective, prescanning and/or a separate encoding scheme would be required for each different type of data expected. These types of data can change unpredictably, even within a given transmission. In many instances, a less-than-optimum code may be quite acceptable to provide reduced overall transmission or data storage time as well as compression.

Accordingly, there is a need for a data compression technique which is suitable for use in a modem or other real time data compression applications, wherein the types of data can change frequently and even during a transmission.

One prior art adaptive real time data compression method relies on dynamically created tables in both an encoding device and a decoding device. In U.S. Pat. No. 4,612,532 of Frances L. Bacon et al., a series of characters in a data stream is encoded in accordance with dynamically created tables in the encoding device, and the decoding device is constructed in a manner to create corresponding tables for decoding the encoding data, relying on the structure of the encoded data to create the decoding tables dynamically. Primarily, the encoding device relies on the assumption that a given character in the data stream has a given probability of being followed by one of a set of probable candidates for the next successive character. Accordingly, the encoding device creates a table in which, for a given character, there is presented a list of candidates, in approximate order of frequency of occurrence, for the next successive character that would occur in the data stream. When the given character occurs in the data stream, followed by a character in the table, the encoding device sends a binary code to represent the latter character based on the character's ordinal position in the table. This code is the shortest for the most frequently occurring candidates and longer for candidates that are less frequently occurring. The table is created based on the local frequency of occurrence of a character after a given character, thereby allowing the table to be changed dynamically as the local frequency of occurrence changes.

In the Bacon patent, it is assumed that the data being compressed is not random, and that a given character has nore than a random chance of being followed by one of a plurality of probable candidates for the next character. This assumption limits the usefulness of the method to applications such as English language text, wherein it is highly likely that the technique can be successfully used. However, in applications wherein a mixture of text and numeric data is involved (such as a spread sheet file), when the data type shifts to numeric from text, compression efficiency will be lost since numeric files are more likely to be random than text files. Nonetheless, when the data type shifts to numeric, the probability of occurrence of the numeric digits increases dramatically compared to the probability of occurrence of text characters, so that increased efficiencies could be obtained if the compression algorithm could adapt to the changing nature of the data type.

Accordingly, the Bacon method is most suitable for applications wherein the type of data is predictable, that is, it is predetermined that the file being transmitted is text or numbers (but not both), or wherein the data is not random. However, in applications wherein the type of data is not predictable, such as where there is mixed text and numbers, or of unknown type, this method will tend to employ a less-than-optimum code. Accordingly, there is a need to provide an adaptive data compression method which is dynamically adaptable to any type of data or distribution of types of data.

SUMMARY OF THE INVENTION

The present invention provides an adaptive data compression method and apparatus which does not require that an input file be prescanned and does not rely upon an assumption of nonrandom data. The method is adaptive to redundancy in any type of data, not just data which is comprised of characters having given probabilities of other characters following a given character. The method is suitable for use in a modem or other applications wherein real time data compression is desirable. Moreover, the resultant code has the desirable property of instantaneous decodability.

Briefly described, the present invention provides a dynamically adaptive data compression method which relies on the periodic accumulation of data statistics and reassignment of compression codes to particular characters as a function of the changing probabilities of occurrence. As in many other data compression techniques, the present invention works on the principle of data statistics. However, these statistics are accumulated "on the fly" in the present invention, eliminating the need to prescan the data to determine its characteristics. Data that occurs more frequently is represented by a compression code having fewer bits than data that occurs less frequently.

Additionally, instead of representing data in bit patterns of arbitrary length, which is commonly employed in optimal code methods such as the Huffman code, the present invention employs a set of predetermined bit length compression codes. In the preferred embodiment bit lengths of four, eight, and twelve bits are employed so that the method may be conveniently implemented in an octet-based packet system or an eight-bit microprocessor. Optimum compression and performance is achieved in the present invention when a greater number of data characters are represented with four bit compression codes.

The preferred method and apparatus has the ability to adapt to changing data characteristics or types. Periodically, the current compression performance is evaluated, utilizing current statistics. In response thereto, the compression "level", that is, the numbers of characters of an alphabet of characters which are associated with the different compression codes, is changed to optimize performance.

The data statistics are kept in a linear array of registers or memory locations called "counts", where there is one element for each possible data character in a data set or "alphabet". These counts contain the number of occurrences of a given data character that occurred in a given number of processed characters. This array is always kept relatively sorted, so the most frequently occurring characters' counts are positioned toward the beginning of the array. The order in which the characters appear in the count array will determine the compression code and accordingly how many four bit nibbles (one, two or three) will be used to represent a character in the input data stream. A first predetermined number a of the characters of the alphabet are encoded as one nibble. The last 16a characters are encoded as three nibbles. The remaining characters are encoded as two nibbles (an eight bit byte), where a is referred to as the "compression level." The value of the number a is periodically recomputed as a function of the frequency of occurrence of characters, as represented by the character counts.

More particularly described, the preferred data compression method is performed in a programmed microcomputer contained in a modem, and comprises the following sequence of steps:

(1) An encoding table having a plurality of digital representations of characters of an alphabet is provided in a memory associated with the microcomputer. Each of the characters has associated therewith a count of the frequency of occurrence of the character. The encoding table is used to compute one of a plurality of compression codes for the characters of the alphabet. Some of these compression codes are shorter than others; the shortest codes are shorter than an uncoded digital representation of the characters of the alphabet.

(2) As an item of data represented by one of the characters of the alphabet is presented for encoding, a compression code which corresponds to the presented particular character of the alphabet is computed using the encoding table. Additionally, the count associated with the particular character is incremented to reflect that this particular character has occurred in the data stream. The computation of the compression code is a function of the position of the presented particular character in the encoding table.

(3) The computed compression code is then provided as a compressed output. This code is transmitted by the modem over a communications link to another modem.

(4) Periodically, the association between the compression codes and the characters of the alphabet in the encoding table are adjusted. This adjustment is a function of the frequency of occurrence of the characters of the alphabet over a predetermined plurality of characters presented for encoding, as represented by the character counts in the encoding table. The size of this predetermined plurality is selected to be a limited number so as to provide for speed of updating. Accordingly, as the frequency of occurrence of characters changes over a plurality of characters presented for encoding, the more frequently occurring characters become associated with shorter compression codes in the encoding table.

As mentioned, the encoding table contains the association of characters and compression codes, and the association of characters and counts. Initially, the characters of the alphabet and their corresponding compression codes are arranged in an initial ordered array with a set of four bit compression codes positioned toward the beginning of the array. The periodic adjustment of the association between codes and the characters of the alphabet is effectuated by the following steps:

(1) In the encoding table, a separate "character count" is maintained for each character of the alphabet.

(2) As an item of data is presented for encoding, and after computation of a code using the encoding table, the character count associated with the character presented for encoding is updated by incrementing.

(3) After the character count is incremented, the character count just updated is then compared to the character count for a preselected character at a position in the array more likely to be associated with a shorter code. In other words, the particular character count is compared to the character count for a preselected character positioned closer to the beginning of the array, where the shorter codes are positioned.

(4) If the particular character count is greater than the character count of the preselected character closer to the beginning of the array, the relative positions in the array of the character just encoded and the preselected character are exchanged. This causes association of the character having the larger character count with a position in the array more likely to be associated with a shorter compression code.

(5) If the particular character count is not greater than the character count of the preselected character closer to the beginning of the array, then step (3) is repeated, by comparing the character count just updated with the character count one step further from the beginning of the array (that is, closer to the character count for the character presented for encoding). This process stops if the character presented for encoding is reached.

Since the periodic adjustment of the corresponding relationship between the codes and the characters of the alphabet is performed for each item encoded, the more frequently occurring characters to tend to migrate toward tbhe beginning of the array and thereby become associated with shorter compression codes. In the disclosed embodiment, the preselected character is positioned a predetermined number of positions in the array toward the beginning of the array, sixteen positions in the preferred embodiment. Thus, the comparison and exchange amounts to a partial or limited sort, and is quick and easy to implement on a microprocessor since a maximum of sixteen compare operations and a single data exchange are all that is required.

Decoding of the compressed data is effectuated by a parallel decoding table maintained according to the same method. The fact that the encoding and decoding tables are adjusted or updated only on a limited basis results in the ability to compress and decompress at very high speeds, well within the capabilities of present data microcomputer circuits. Advantageously, therefore, the present invention, when implemented in a modem, can handle 19,200-bit per second asynchronous data communications because of the speed at which the tables are updated.

Still further described, the preferred method of the present invention includes steps taken to maximize the numbers of characters associated with shorter compression codes. Initially, the array is preset with a predetermined number of characters of an alphabet associated with four bit codes, sixteen times this number of characters associated with twelve bit codes, and the remainder of the alphabet being associated with eight bit codes. The encoding level, represented by the predetermined number a, is dynamically altered as data statistics are accumulated, to reflect that characters having a high probability of occurrence should receive a four bit code. Accordingly, steps are taken to periodically adjust the sizes of the sets of numbers of characters associated with four, eight, and twelve bit codes. This involves summing groups of character counts to obtain "group counts" for the less frequently occurring characters, comparing the group counts to the character counts for more frequently occurring characters, and successively increasing the number of items in the set of four bit codes (i.e., the shortest codes) until there is a correspondence between a group count and a character count. In this manner, the size of the set of characters associated with the shortest digital codes is increased to include more characters having a higher probability of occurrence, resulting in more optimum use of the shorter character codes. In other words, more of the shorter codes are assigned to more frequently occurring characters and more of the longer codes are assigned to the less frequently occurring characters.

Yet still further described, the present invention includes a novel and advantageous method for representing a string of repetitive characters. As will be known to those skilled in the art, repetitive characters strings are frequently encountered in certain types of data files transmitted by a modem, for example spreadsheet files. The method entails the entry by both the encoder and the decoder into a "repeat state" upon the occurrence of a character string exceeding a predetermined number of characters, say for example, three. The repeat state is automatically entered following the transmission or recording of the three repetitive characters. After this repeat state is entered, a "repeat indicia" indicative of the number of additional occurrences of the repetitive character (after the predetermined number) is transmitted or recorded. This repeat indicia can represent a number of additional occurrences up to a second predetermined number, say fifteen, or it can represent the second predetermined number, which is also indicative that the repeat state is to continue and that a subsequent repeat indicia is expected. Advantageously, data which frequently includes strings of repetitive characters exceeding the first predetermined number will realize significant compression.

Accordingly, it is an object of the present invention to provide a data compression method and apparatus which is dynamically adaptable to changing data statistics on a real time basis.

It is another object of the present invention to provide an improved data compression method and apparatus which does not require prescanning of data in order to select an optimum code.

It is another object of the present invention to provide a data compression method wherein the codes employed to represent information are instantaneously decodable.

It is another object of the present invention to provide an improved data compression method and apparatus which is suitable for use in data communications applications such as a modem.

It is another object of the present invention to provide an improved data compression apparatus and method which dynamically adapts to changing data characteristics.

It is another object of the present invention to provide an improved data compression method and apparatus whih can dynamically adapt to compression of text files, graphics files, mixed text and graphics, software object code, spreadsheet files, interactive communications with other systems, or other types of data, where such data types can change rapidly and even during a transmission.

It is another object of the present invention to provide an adaptive data compression method which is dynamically adaptable to any type of data or distribution of types of data.

It is another object of the present invention to provide an improved data compression method and apparatus which is also suitable for us in data recording or storage applications such as a disk drive.

It is another object of the present invention to provide an improved data compression method and apparatus which may be efficiently implemented with an eight-bit microprocessor or a packet-oriented system, and can handle 19,200-bit per second asynchronous data communications.

It is another object of the present invention to provide an improved data compression method and apparatus which is able to compress streaming data without adding appreciable delay to the transmission and/or storage of the data.

It is another object of the present invention to provide an improved data compression method and apparatus wherein the compression performance is periodically evaluated using statistics accumulated over a predetermined interval or number of characters, and the level or degree of compression changed in response thereto to optimize performance.

It is another object of the present invention to provide an improved data compression method and apparatus having an improved repeat character state wherein repetitive consecutive occurrences of a character are represented in a compressed manner.

It is a specific object of the present invention to provide a data compression method and apparatus for use in a modem which is able to reduce transmitted data to about five bits on the average for each character of typical ASCII text files.

It is another specific object of the present invention to provide a data compression method which is simple enough that it can be implemented on an eight-bit microcomputer and still allow the microprocessor to handle a two-way 19,200-bit per second synchronous channel and still be able to handle X.25 protocol functions.

These and other objects, features and advantages of the present invention will become more apparent and be more clearly understood and appreciated from a review of the following detailed description of the disclosed embodiments and by reference to the appended drawings and claims.

BRIEF DESCRIPTION OF THE DRAWINGS

FIGS. 3-16 illustrate an exemplary data stream which is compressed according to the preferred method disclosed herein and the resultant encoding tables at various points within the compression operation.

Figure 1:
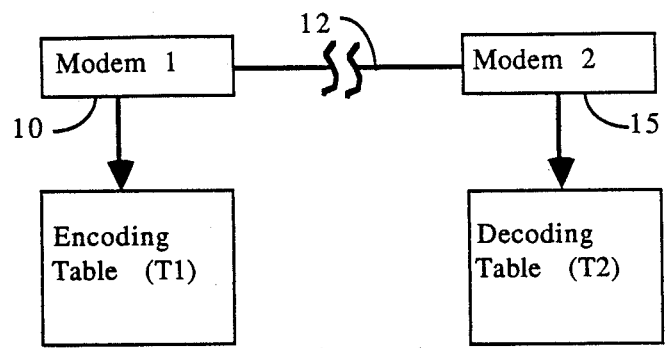
FIG. 1 schematically illustrates a data communications application employing the preferred data compression method and apparatus of the present invention.

Appendices I-VI are tables of hexadecimal representations of character positions of an alphabet employed for representing data and the hexadecimal compression codes used to represent encoded compressed data.

DETAILED DESCRIPTION OF THE PREFERRED EMBODIMENT

Referring now to the drawings, in which like numerals illustrate like elements throughout the several figures, the preferred method for data compression is suitable for use in a modulator/demodulator ("modem") employed in data communications applications, such as the modem 10 which transmits data via a communications link or telephone line 12 to a second modem 15. Although the disclosed preferred embodiment is for use in a modem, it should be understood that the present invention is suitable for use in any type of data compression application, for example mass data storage, database compression, telemetry, video/picture compression, speech compression, seismic data compression, and the like.

It should be understood from the outset that the preferred embodiments of the present invention rely on the use of an encoding device for compressing data and a separate but parallel decoding device for decoding compressed data. In accordance therewith, the modem 10 constructed in accordance with the preferred embodiment has associated therewith an encoding table T1, constructed in the manner which will be described below. Similarly, the modem 15 has associated therewith a decoding table T2, which is maintained in parallel with the encoding table T1, also as will be described below.

Next, a few definitions are in order. It should first be understood that as the term is used herein, the word "alphabet" means a set of characters which are used to represent information. For example, the ASCII data set, which consists of 256 characters, is considered an "alphabet". It will also be appreciated that the EBCDIC standard may also be considered an "alphabet".

The word "character" as used herein is not limited to a letter or numeral or digital code, but means any type of informational element capable of being encoded in binary code. Most, but not all, characters will be encoded according to a predetermined format. It will therefore be appreciated that in the ASCII or EBCDIC standards, a comma, a space, a numeral, and a letter are all considered "characters". Similarly, a numerical digit is considered a character, as is a purely binary coded representation of data not otherwise associated with any format.

Figure 2:
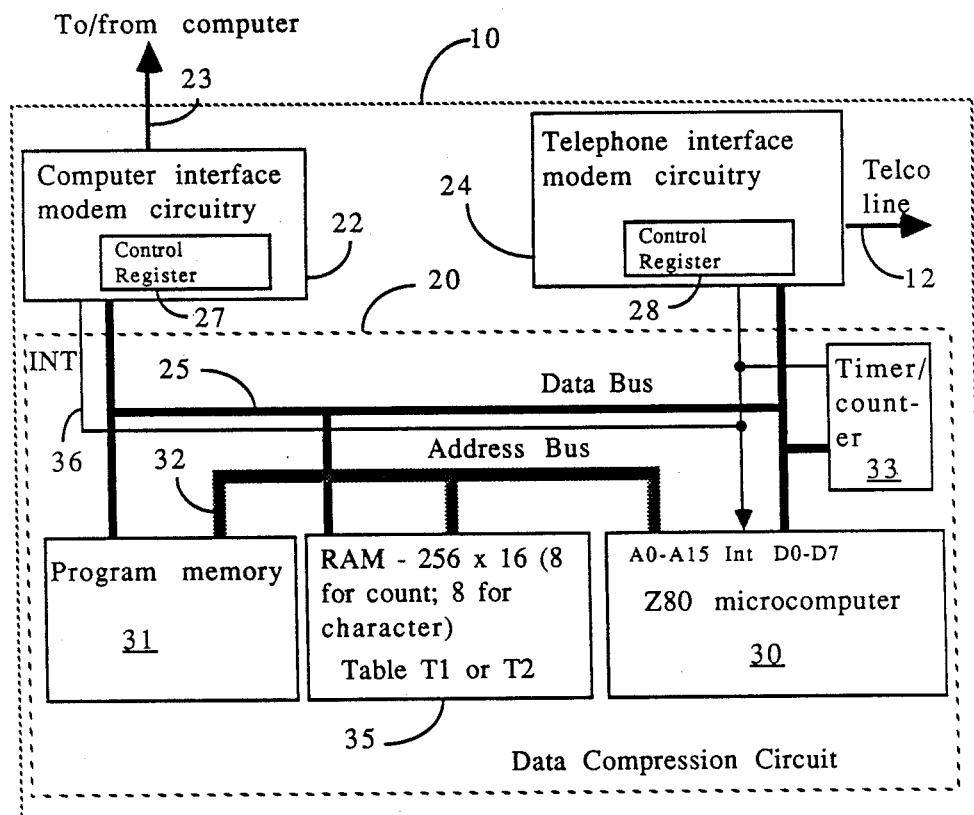
FIG. 2 is a block schematic diagram of a microcomputer based circuit for implementing the preferred method of data compression in a modem.

The encoding table T1 and the decoding table T2 in the preferred embodiment are both implemented as a data array contained in a memory associated with a microcomputer, such as is illustrated in FIG. 2. Typically, modem 10 which incorporates means for effectuating the data compression method disclosed herein will include a data compression circuit 20. The data compression circuit 20 is connected to a modem computer interface circuit 22. The modem computer interface circuitry 22 is a conventional modem circuit and comprises circuitry for receiving a character of data over line 23 from an input source such as a computer, and preparing that item of data for transmission. Typically, the characters of data are received as an eight bit byte. This eight bit byte is provided on a data bus 25 which is connected to the data compression circuit 20.

The results of data compression are provided on the data bus 25 to modem telephone interface circuit 24, which receives data from the compression circuit 20 and conditions the data for serial transmission over a communications link such as the telephone company line 12. In the preferred embodiment, data provided from the compression circuit 20 to the modem telephone interface circuit 24 is encoded in the manner described hereinbelow to represent the character which was provided to the compression circuit by the modem computer interface circuit 22.

The preferred embodiment of the data compression circuit 20 comprises a Z80 microcomputer 30 which is responsive for receiving a byte of data from the modem computer interface circuit 22, compressing it, and then providing the encoded result back over the data bus 25, except directed to the modem telephone interface circuit 24 for serial transmission. The Z80 microcomputer circuit, manufactured by Zilog Corp., is an eight-bit microcomputer and is well known to those skilled in the art. Accordingly, further details of this circuit and its operation will not be provided herein, and are available in the literature supplied by the manufacturer.

Additional components in the preferred embodiment operative together with the microcomputer 30 include a program memory 31 which contains the program for the microcomputer 30. This program memory, preferably a programmable read-only memory ("PROM") is connected to the data bus 25 so that program instructions can be transmitted to the microcomputer 30 under program control. The address bus 32 of the microcomputer 30, consisting of lines A0–A15, is connected between the program memory 31 and the microcomputer 30 so that address signals from the microcomputer can address the program memory in the known manner. A programmable timer/counter circuit 33 is connected to the microcomputer 30 via data bus 25 for implementation of timing routines. In the preferred embodiment, the circuit 33 is a Zilog Z80-CTC, which has four independent timer circuits, and generates unique interrupt vectors to facilitate interrupt driven timing routines.

The encoding table T1 (or decoding table T2, in the case where decompression is to be performed) is contained in a random access memory ("RAM") 35, which is connected to receive address signals on the address bus 32 and to receive and transmit data signal over data bus 25. In one embodiment, the random access memory 35 is a 1024×8 bit memory, arranged as 512×16. This particular configuration readily allows for a 256 character alphabet: eight bits are provided for each character of the alphabet, eight bits are provided for a character count for each character of the alphabet, and twelve bits (three four-bit nibbles) are computed for the compression code for each character. This arrangement therefore employs 256×28=7168 bits of 8192 provided. It will of course be understood that the size of this memory may be smaller or larger depending upon the size of the alphabet, the number of bits used to encode the alphabet, and the number of bits used to represent the character count.

In the preferred embodiment, the compression code of twelve bits is computed in real time by microcomputer 30 rather than stored. This configuration allows random access memory 35 to be 256×16=4096 bits, for storage of eight bits for each character of the 256 character alphabet and eight bits for a character count for each character of the alphabet.

Control signals associated with the microcomputer 30 are not illustrated in FIG. 2, inasmuch as such elements will be known to those skilled in the art. However, it should be understood that since the preferred embodiment of the present invention operates to compress each character of an input data stream, each character to be encoded is provided by the modem computer interface circuit 22 for compression, one character at a time. The presence of a character for compression is signalled by an interrupt (INT) on line 36 which is provided from the modem computer interface circuit 22. In a similar manner, the modem telephone interface circuit 24 provides the INT signal when the system is employed in the decoding mode; the respective INT signals from the modem circuits 22, 24 are wire-ORed so that either may generate an interrupt. The interrupt signal informs the microcomputer 30 of the presence of data for encoding or decoding, as the case may be, on the data bus 25.

Also included within the modem interface circuits 22 and 24 are control registers 27, 28, respectively, which are employed to assist in the interface between the modem interface circuits and the data compression circuit 20. The control registers 27, 28 serve the function of providing various control signals needed to interface with the microcomputer 30. For example, when the microcomputer 30 is conditioned to be in an encoding state, the microcomputer must acknowledge the receipt of a character from the circuit 22 for encoding. Accordingly, the microcomputer 30 responds in a handshaking fashion to an interrupt from the modem computer interface circuit 22 by setting a bit in the control register 27 to acknowledge the interrupt and signal that the microcomputer is "busy". When the microcomputer is able to accept another character for encoding, this "busy" bit is cleared, and the modem computer interface circuit is then conditioned to provide another character for compression and ultimate transmission.

In a similar fashion, control register 28 facilitates the interface between the microcomputer 30 and the modem telephone interface circuit 24. For example, when a coded compressed representation of a character is ready for transmission, the microcomputer 30 sets a bit in the control register 28 of the modem telephone interface circuit to signal this circuit that a code is ready for transmission, and has been placed on the data bus 25 for strobing into an appropriate storage register (not illustrated) in the circuit 24.

It will also be understood that when the system is configured in the decoding mode, the data paths are reversed from that just described. Data will be received from the telephone line 12, provided through the modem telephone interface circuit 24 to the microcomputer 30 for decompression, and then provided to the modem computer interface circuit 22 for provision over line 23 to the computer. Accordingly, data received over the telephone line 12 is provided through the modem circuit 24 and converted into an eight bit byte for provision over the lines 25 of the data bus to the compression circuit 20, which is placed in a "decoding" or decompression state. The control register 28 serves a handshaking function similar to that performed by the control register 27 as the data is communicated between the modem telephone interface circuitry 24 and the compression/decompression circuit 20.

Next will be a discussion of the theory and operation of the preferred method and apparatus for data compression. Generally speaking, the preferred data compression method comprises a sequence of steps which are implemented as a program for the microcomputer 30. These steps may be described as follows:

(1) An encoding table T1 having a plurality of entries associated with characters of an alphabet is provided in the RAM 35. Also provided in the encoding table is a count associated with each character of the alphabet. The alphabet in the preferred embodiment has n=256 characters, and comprises the ASCII data set; the encoding table T1 is provided in a compressing or transmitting modem 10. The encoding table is used to compute a compression code, in the manner which will be described below. The compression codes have a predetermined number z of bits, but there are a plurality of sets of compression codes provided in the preferred embodiment. The number z is the same within each set of compression codes, but varies between sets of compression codes. Some of these compression codes are shorter than others; the shortest codes are shorter than an uncoded representation of the characters of the alphabet. In the disclosed embodiment, there are three sets of compression codes; four bit codes, eight bit codes, and twelve bit codes. Thus, z is four, eight, or twelve.

(2) Items of data for encoding are presented in a sequential data stream. Each separate item may be generally referred to as an item x. As an item x of data represented by one of the characters of the alphabet is presented for encoding, a compression code which corresponds to the presented particular character of the alphabet is computed based on the order number of the item x in the encoding table and the compression level a.

(3) The selected compression code is then provided as a compressed output. This code is transmitted by the modem over the telephone line 12 to the receiving modem 15.

(4) Periodically, the relationship between the compression codes and the characters of the alphabet in the encoding table T1 are adjusted. The adjustment only occurs for characters which occur relatively frequently when compared to other characters, and involves changing the compression code associated with a particular character. The adjustment is based upon the frequency of occurrence of the particular characters of the alphabet over a predetermined plurality of characters presented for encoding, as represented by the character counts in the encoding table. The size of this predetermined plurality, represented by the number k, is selected to be a limited number so as to provide for speed of updating. Accordingly, as the frequency of occurrence of characters over k characters presented for encoding changes, the more frequently occurring characters become associated with shorter compression codes in the encoding table.

As described, the encoding table T1 contains the characters of the alphabet and the counts associated with the charcters, and may contain the compression codes associated with the characters if the compression codes are computed. Initially, the characters of the alphabet and their corresponding compression codes are arranged in an initial ordered array, with a set of a four-bit codes positioned toward the beginning of the array. There are b eight bit codes and c twelve bit codes. The periodic adjustment of the association between compression codes and the characters of the alphabet is effectuated by the following steps:

(1) In the encoding table T1, a separate "character count", referred to as CC, is maintained for each character of the alphabet.

(2) As an item of data x is presented for encoding, and after computation or selection of a compression code using the encoding table, the character count CC associated with the character presented for encoding is incremented.

(3) After the character count is incremented, the character count just updated is then compared to the character count for a preselected character at a position in the array more likely to be associated with a shorter code. This preselected character is the disclosed embodiment is d places closer to the beginning of the array; d is sixteen in the preferred embodiment. In other words, the just-updated particular character count is compared to the character count for a preselected character positioned closer to the beginning of the array, where the shorter codes are positioned.

(4) If the character count of the preselected character closer to the beginning of the array is less than the particular character's count, the relative positions in the array of the character just encoded and the preselected character are exchanged. If the character count of the preselected character closer to the beginning of the array is not less than the particular character's count, the same comparison is made with each character count moving closer to the position of the count just updated, until a smaller character count is found and the described positional exchange is made, or until all d counts have been compared. This causes association of the character having the larger character count with a position in the array more likely to be associated with a shorter code.

It should be understood at this point that particular compression codes are associated with particular positions in the array, and that exchanging positions of characters entails moving a character and its associated character count to a different position in the array so that the character becomes associated with the compression code formerly associated with the character having the lower character count.

Since the periodic adjustment of the corresponding relationship of the compression codes and the characters of the alphabet is done for each item encoded, the more frequently occurring characters tend to migrate toward the beginning of the array and thereby become associated with shorter codes. This migration is relatively gradual, since a character can move no more than d=16 positions at one time. Thus, the comparison and exchange amounts to a partial sort, and is quick and easy to implement on a microprocessor since only a small number of compare operations and data exchanges is required.

Still further steps are taken in the present invention to maximize the numbers of characters which are associated with shorter codes. This involves adjustment of the sizes of the sets of compression codes, i.e., the values of a, b, and c. In the disclosed embodiment, the values of b and c are functions of a. Initially, the array in the preferred embodiment is preset with a predetermined number a of characters of the alphabet being associated with four bit codes, sixteen times this number being associated with twelve bit codes, and the remainder of the alphabet of characters being associated with eight bit codes. The "encoding level", represented by the predetermined number a of characters associated with four bit codes, is dynamically altered as data statistics are accumulated, to reflect that characters having a high probability of occurrence should receive a four bit code in order to realize greater compression. Accordingly, steps are taken to periodically adjust the size of the sets of numbers of characters represented by four, eight, and twelve bit codes. This involves the following steps:

(1) For a given plurality k of items presented for encoding, 128 in the preferred embodiment, the character counts for predetermined groups of consecutive characters are summed to obtain a plurality of "group counts". In the preferred method, these group counts or sums are obtained by breaking the 256-character alphabet into groups of sixteen, thereby providing sixteen groups. Thus, there are sixteen group counts.

(2) The group counts for groups toward the end of the array are then successively compared with the character counts for single characters at the beginning of the array, beginning with a comparison of the group count of the last group of characters to the character count for the first and most frequently occurring character.

(3) The number of items a in the set of four bit codes, which are the shortest codes, is increased until there is a correspondence between a group count and a character count, moving from the last group count toward the beginning of the array. In this manner, the size of the set of characters associated with the shortest digital codes is increased to include more characters having a higher probability of occurrence, resulting in more optimum use of the shorter character codes. Essentially, this entails assigning more of the shorter codes to more frequently occurring characters and more of the longer codes to the less frequently occurring characters. In the preferred method, there are three sets of codes, and the set of a members associated with the four bit codes varies in size between zero and fifteen members, while the set of c members associated with the longest digital codes varies in size between zero and 240 members.

As has been described, the data compression method in the preferred embodiment is effectuated with a program for the microcomputer 30. The following more detailed description of the preferred method for data compression may be implemented as a series of program instructions for the microcomputer 30, and after the following discussion, those skilled in the art will understand how to program the microcomputer 30 to accomplish the objectives of the present invention. Reference will also be made to FIGS. 3-16 in the discussion which follows:

(1) First, an alphabet of n characters must be selected to be employed in representing information. As discussed above, this alphabet of characters can be any predetermined set of n characters. In the preferred embodiment the set of ASCII characters is employed inasmuch as the data communications involving this character set is one primary area of usefulness for the present invention. The alphabet in the preferred embodiment comprises n=256 eight bit ASCII characters. Such as alphabet is shown in FIG. 3, wherein a carat ( ⌃ ) preceding a character indicates an ASCII control character, a "v" preceding a character indicates an ASCII graphics symbol, and a plus ("+") preceding a character indicates an italics ASCII character.

(2) The characters are first arranged in an initial ordered array within the memory 35 in some predetermined order to form the table T1. In FIG. 3, the characters are arranged in order of the hexadecimal representation of the ASCII data set. Inasmuch as the preferred method disclosed herein is dynamically adaptive to changing data statistics, it is not necessary that an attempt be made to arrange the characters in any particular order. Nonetheless, in some applications it may be expected that certain types of data are more likely to occur than others, for example it may be known in some circumstances that English language text is more likely to be encountered. In such applications, then an attempt may be made to order the characters in order of descending expected probability of occurrence, with the expected most frequently occurring character positioned at the beginning of the array and the expected least frequently occurring character at the end of the array. Such a prearrangement allows more rapid adaptation of the algorithm to the most likely data stream to be encountered.

(3) Next, there must be provided a set of compression codes to be used for encoding the characters of the alphabet in a compressed fashion. In the preferred embodiment, there are three sets of compression codes used to encode characters: a four bit nibble, an eight bit byte, or twelve bits. Generally speaking, however, the compression codes have z bits, and there is provided at least a first set of p-bit compression codes for encoding some of the characters of the alphabet and at least another set of r-bit compression codes used for encoding other ones of the characters of the alphabet. In the preferred embodiment, a first set of p-bit compression codes is used for encoding a first predetermined number a of the n characters, a second set of q-bit codes are used for encoding a second predetermined number b of the n characters, and a third set of r-bit codes are used for encoding a third predetermined c of the n characters. In this particular situation, a+b+c=n, since all of the characters must be represented one of the three different sets of codes. In the preferred embodiment, z can take on one of three values: p=4, q=8, and r=12.

It should also be understood that in general, there are at least two sets of compression codes of different lengths, wherein the first set of a characters have p-bit codes, and the second set of c characters have r-bit codes. It just so happens that there are three sets of compression codes in the preferred embodiment, although it will be understood that more sets may be used.

The compression codes employed in the one embodiment are illustrated in Appendices I-VI, for six exemplary compression levels. In these appendices, the columns labeled IN represents the position of a character in the array of table T1, as indicated by a hexadecimal positional identifier ranging from 0 to FF. The compression codes associated with the positions in the array are shown in the columns labeled OUT, and are hexadecimal representations also. It should be understood that in the preferred embodiment, the compression codes shown in the Appendices are computed in real time based upon the position of a presented character in the encoding table. The method for real time computation is discussed in detail below. However, the codes can be precomputed and stored in a memory in the form as illustrated in the Appendices.

It should also be understood that these compression codes are not a static table of codes; rather, the codes are dynamically altered as a function of the compression level. Referring in this regard to Appendix I, it will be noted that this table represents a compression level wherein a=1, that is, only one character receives a four-bit compression code. This code is the hexadecimal 0 in the first OUT column. In accordance with the disclosed method, there are c=16a=16 codes of twelve bits. These may be seen in the last OUT column of Appendix I, and range from hexadecimal FF0 to FFF. The remainder of the codes, b=n−a−c=239 codes are eight bit codes, ranging from hexadecimal 10 in column 1 to FE in the last column.

The compression level wherein a=0 represents one extreme in the preferred embodiment. In this case, all data is represented by eight bit compression codes, and no compression (or expansion) takes place. This case is optimum for purely random data. Another extreme is wherein the compression level is a=15, that is, there are sixteen members of the set of characters being associated with a four-bit compression code. This example is illustrated in Appendix VI. It will be noted that there are a=15 characters associated with four bit codes, ranging from 0 through E. This results in c=16a=16(15)=240 characters being associated with twelve bit codes, ranging from F10 to FFF, and but one character being associated with an eight bit code, F0.

A more frequently-encountered compression level is illustrated in Appendix V, wherein a=12. Such a compression level will likely occur after the accumulation of some data statistics, and a pattern of recurring characters emerges in the data stream being processed. In this appendix, eight characters are associated with four bit codes, ranging from 0 to B. There are c=16a=16(12)=192 characters associated with twelve bit compression codes, ranging from F40 to FFF. This leaves 256−12−192=52 characters for eight bit compression codes, ranging from hexadecimal C0 to F3.

It will be observed from an inspection of the Appendices I–VI that the interpretation of any given compression code is a function of the compression level, a. That is, given a compression level and up to twelve bits of data which represents a compression code, a position in the table (and also the corresponding character of the alphabet) is uniquely identified. In yet other words, all compression codes are instantaneously decodable. This is possible because the compression level, a, determines how many characters have four bit codes, and the value of a determines the values of b and c, the numbers of characters having eight and twelve bit codes, respectively. Thus, if the compression level is 12, as in Appendix V, the first twelve hexadecimal numbers in the first OUT column 0 through B represent an entire code; if a C is encountered, it necessarily follows that at least one more hexadecimal digit follows, since the number of four bit codes has been exhausted after B. In like manner, after the next 52 characters receiving eight bit codes have been exhausted, which occurs after the compression code F3 in Appendix V, it necessarily follows that a twelve bit code is expected, requiring three hexadecimal digits, F40 et seq.

(4) The next step taken, after establishing these initial parameters, is to provide a sequential input information stream represented by the characters of the alphabet to be encoded with the compression codes.

(5) For each character of the input information stream provided sequentially for encoding, referred to as an item x, a number of steps are taken. These steps are as follows:

(i) a compression code using the encoding table T1 is computed or chosen as a function of the relative position in the array of the character corresponding to the item x. Essentially, this involves indexing, hashing, or conducting a sequential search into the table T1 until a match is found between the character representing the item x and the same character in the Table T1. This uniquely identifies a compression code. For example, and referring now to FIG. 3, the exemplary data stream "The Hayes Compression . . . " begins with the character T. It will be seen that this character occupies a position in table T1 in the sixth column, the fifth character down, and corresponds to hexadecimal position 54 in the IN columns of the Appendices. Accordingly, for encoding of this character, the compression code associated with the compression level associated with the position hexadecimal 54 is selected or computed and provided as a compressed output.

In the preferred embodiment, as has been mentioned, the compression codes are computed in real time by microcomputer 30. Computation in real time is preferable because without it there are sixteen possible compression code tables, and each would have to be stored in ROM or RAM, requiring 16×256×8=4,096 bytes of storage. Alternatively, a single compression code table could be provided, but it would have to be updated each time the value a changed.

The method for computing the compression code employed in the preferred embodiment is as follows. The position of the submitted data item x is found in the table T1. This allows ready identification of the compression level. If the position of x, called here p(x), is less than a, the compression code is the four bit nibble equal to p(x). For example, referring to Appendix IV, if the character occupies position 4 in the first IN column, the compression code 4 is the appropriate result.

If p(x) is greater than (255−16a), then a three-nibble code is sent, hexadecimal F followed by the eight bit number p(x). For example, with a=8 in Appendix IV, a character occupying position A0 in the sixth IN column receives the compression code position A0 in the sixth IN column receives the compression code FA0.

Otherwise, the two-nibble code p(x)+15a is sent. For example, a character occupying position 60 in the fifth IN column in Appendix IV receives the compression code (60+15(8))=D8 hexadecimal. All of these computations are fast and easy to implement on a microcomputer since multiplication by sixteen is four shift-left operations, while multiplication by fifteen is four shift-lefts and subtract the original byte.

In FIG. 3, the compression level is 4, which corresponds to the compression codes in Appendix III. As is evident in FIG. 3, the character T results in the selection of a q bit code, which is provided as an output. It will be understood that the table shown in FIG. 3 does not have the appropriate codes of Appendix III shown therein. In Appendix III, which is the table of codes for compression level four, the hexadecimal code corresponding to the character position for T in the array of FIG. 3, which is represented by the hexadecimal characters 54, results in the computation or selection of the hexadecimal compression code 90. It will thus be understood that after the appropriate character position for an item to be encoded is found in the exemplary table T1 of FIG. 3, the corresponding compression code is computed, or alternatively selected from Appendix III.

(ii) The next step taken for each item of the input information stream is to increment a character count associated with the character of the alphabet which represents the particular item of the input information stream. This character count, referred to as "CC", comprises the vehicle for maintaining data statistics on the frequency of occurrence of the character.

(iii) After the character count CC has been incremented, it is compared with the character count associated with each character within a predetermined range higher, that is toward the beginning, in the array. This comparison is conducted up to a predetermined number d places in the array, where d is a predetermined number less than n. In the preferred embodiment, this comparison is conducted up to sixteen places in the array and no more, primarily so as to not add an appreciable time delay resultant from processing time. Assuming a clock frequency of 2.5 MHz for the microcomputer 30, and the usage of the CPIR instruction ("compare, increment, and repeat", requiring at most 21 clock cycles), a search and comparison of up to sixteen memory locations can be conducted within about 135 microseconds employing the preferred Z80 microcomputer. Although other instructions must be executed for each character processed, the operations associated with the character counts comprise a significant portion of the processing time for each character. Accordingly, it will be appreciated that the 19,200 bits per second target bit rate (which corresponds to 1920 characters per second) for a modem employing the present invention, which corresponds to an average time of about 416 microseconds per eight bit character processed, will not be impacted. Of course, if a faster microcomputer is employed, the impact will be even less.

Accordingly, in FIG. 3, the character count CC for the character T is compared to the character count for each character above the T in column six up to the character D in column five.

(iv) When the character count CC is found to be greater than or equal to the character count for a character closer to the beginning of the array within the predetermined range of d characters, an exchange is performed. The relative positions in the array of the character corresponding to the item x and the character lower in the array having the equal or lesser character count are then merely swapped in position, producing the result as shown in FIG. 4. Inasmuch as after the first character of the exemplary data stream, only the character T has a character count, the exchange results in a pairwise swap of the positions of the characters T and D.

The effect of incrementing the character count in response to the occurrence of a character, and comparison of the character count to the character count for each charcter within a predetermined range lower in the array, is to provide a partial sort, so as to gradually order the probabilities of occurrence of particular characters in descending order. Although the partial sort is only within a predetermined range and not a complete sort, the fact that the comparison is done for each character results in a gradually sorted table. Moreover, the more frequently a character occurs, the more frequently it is repositioned within the table, so that the effective sorting rate for these characters is greater. This of course provides the desired result of a more rapid approach to use of a four bit compression code for those characters having higher probabilities of occurrence.

It will now be appreciated that the foregoing actions are taken for each character presented for encoding. Of course, it will be understood that in FIG. 4, after the pairwise exchange illustrated therein, the character T, now being associated with position five in the fifth column, is now at a position corresponding to IN position 44 in Appendix III and receives the OUT compression code 80, which will be be provided on the next occurrence of the character T. The character D now is associated with the fifth position in the sixth column, corresponding to the position 54 in Appendix III, and receives the compression code 90.

Referring next to FIGS. 5 and 6, the states of the table T1 after the second and third characters of the exemplary data stream may be seen. After the second character in the exemplary data stream, which is an h, the character count associated with the h is incremented. When comparing the state of the character counts after the processing the h, it will be observed that the count for h is greater than the count for W, resulting in the exchange of positions as illustrated in FIG. 5. In a similar manner, when processing the third character in the exemplary data stream, an e, the count for e is incremented and compared to the count for U in FIG. 5. Since the count for e is higher than the count for U, the positions of the e and the U are exchanged, resulting in the placement as illustrated in FIG. 6.

Referring next to FIGS. 7 and 8, the conditions of the table T1 before and after the end of the first line of the exemplary data stream are illustrated. It may be seen from an inspection of these figures that data statistics have begun accumulating in a significant manner, and that a significant shifting of character positions has taken place. For example, it will observed that by the end of the first line of the exemplary data stream, the space character sp is the most frequently occurring character, having occurred nine times of the first line. The character o is the next most frequent character, having occurred six times. It will also be noticed between FIGS. 7 and 8 that the character a, the last character on the line, continues to move toward the beginning of the array in the manner described as its character count increases.

By the end of the second line, as illustrated in FIGS. 9 and 10, the table T1 has been significantly sorted, with the characters now arranged in an apparent order of decreasing probability of occurrence. It should be recalled that at the point of FIGS. 9 and 10, the initial encoding level of four, wherein only four of the most frequently occurring characters are encoded with four bits, still remains. It will thus be understood that only the characters sp, s, e, and t are encoded with four bits, while virtually all the remaining characters which have occurred in this exemplary data stream are encoded with eight bits.

Next will be provided a more detailed discussion of the steps taken in the preferred embodiment to change the encoding level periodically. The term "encoding level", it will be recalled, means simply the value of the number a of characters which are associated with the shortest code. Changing the encoding level allows the maximization of the numbers of characters associated with shorter codes. Initially, the array is preset with a predetermined number a of four bit codes, b=16a twelve bit codes, and the remainder of the alphabet, c=n−a−b, being associated with eight bit codes. The encoding level is dynamically altered as data statistics are accumulated, to reflect that the more characters there are that have a high probability of occurrence, the more characters should receive a four bit code.

Accordingly, steps are taken to periodically adjust the size of the sets of numbers of characters represented by four, eight, and twelve bit codes. In the preferred embodiment, this periodic adjustment occurs after a predetermined number k characters where k is 128 in the preferred embodiment. However, it is not necessary that the adjustment of the encoding level be done after a predetermined number of characters or after a predetermined time; rather, the important concept is that during the actual compression and/or transmission or storage of data, the statistics pertaining to the data being compressed are analyzed so that the encoding scheme may dynamically adapt to the possibility that data statistics change. This periodic adjustment could occur as a function of time as easily as a function of the number of characters being processed, or in any other manner during the processing as may occur to those skilled in the art.

In the preferred method, the encoding level is changed by adjusting the relative values of the numbers a, b, and c; the numbers b and c are functions of a. The preferred steps for adjusting the encoding level are as follows:

(i) First, the character counts for consecutive groups of characters are obtained, yielding a plurality of "group counts". In the preferred method, consecutive groups of m characters are summed to obtain a plurality of n/m=256/16=16 group counts. As may be seen in FIG. 11, the group counts correspond in the preferred method to sums of columns of 16 characters, when the array is viewed two dimensionally rather than linearly.

(ii) The group count for each group, beginning at the rightmost position in table T1, is then compared to successive character counts beginning at the top of the array. In other words, the rightmost group count in FIG. 11 is compared to the character count for the most frequently occurring character sp, the next rightmost group is compared to the next most frequently occurring character e, and so on. (Note: the group counts are zero for all groups until the tenth column from the right in FIG. 11, so these group counts are not all shown.) Mathematically stated, this comprises comparing the group count for group (n/m)−i−1 to the character count for the character j, where i is an integer index of group counts beginning at zero, and where j is an integer index into the array beginning at zero at the beginning of the array. It will thus be understood that there are 0–15 groups.

(iii) In the event that the group count being compared to the character count is less than the character count, then the next column or group count moving leftward is compared to the next character count. Stated more precisely, if the group count for the group (n/m)−i−1 is less than the character count for character j, then i and j are incremented and the comparison step is repeated. The steps of comparison and incrementing are repeated until there is a correspondence between a group count and a character count.

(iv) When the group count matches the character count for a particular character, then the comparison stops, and an encoding level is established as a function of the number of comparisons made until correspondence was found. For example, it may be seen in FIG. 11 that the group count for the eighth column from the right, which is zero, equals the character count for the character-H. At this point, it will be observed that the frequency of occurrence for the characters which follow the -H is approximately the same as the frequency of occurrence of any character within the group being compared. Thus, in the preferred method, the comparison stops at this point, and an encoding level is established one position immediately preceding the point at which there was a correspondence between the group count and the character count.

In other words, and referring now in this regard to FIG. 12, a new encoding level of a=8 characters is established since the character-M, the last character in the set of characters which now receive four bits coding, is one character lower in the array than the point of correspondence between the group count and character count shown in FIG. 11. Note further in FIG. 12 that the positional exchange between characters continues after the level calculation, as it will be noted that the character-J, which in ACSII represents a line feed character, has exchanged places with the character-H.

Still further steps are taken, as shown in FIG. 12, in response to the establishment of a new encoding level of a=8. Firstly, it will be noted that the computation of a results in c=16a=128 characters now receiving twelve bit compression codes, and b=256−a−c=120 characters now receiving eight bit compression codes.

Furthermore, it will be noted in FIG. 12 that the character counts have been divided in half (with downward rounding) after the level recalculation. Rather than completely resetting the table T1 at the beginning of a new set of k characters, and rather than maintaining all of the prior history of the preceding k characters, in the preferred method only some of the prior history is preserved. This is accomplished by halving the character counts at the beginning of each new set of k characters, which serves the dual function of preserving some prior history of the preceding characters while not biasing the table so heavily that the speed of adaption to changing data statistics is inhibited. Although the preferred method involves halving the character counts, those skilled in the art will understand and appreciate that the amount of prior history preserved and the speed of adaptation to changing data characteristics can be adjusted to a degree by the amount by which the character counts is reduced. Reducing the character counts by half is particularly convenient to execute in the preferred embodiment since all that is required is a shift operation performed at each memory location containing a count, a task which is simple to implement with the preferred Z80 microcomputer.

FIGS. 15 and 16 illustrate the second level recalculation, which is taken after the next k=128 characters, that is, after the word in on line 5 in the exemplary data stream. It will be observed in FIG. 15 that when comparing the group counts, beginning in the right of table T1 and moving leftwardly, to the character counts, beginning at the most frequently occurring character sp and moving downwardly in the array, there is a correspondence between character counts and group counts for the character l (with a character count of four) and the group three (the fourth group from the left; the group count is four). This results in the establishment of a new encoding level of a=12 characters, such that all characters lower than-M in the first column of FIG. 16 thereafter receive four bit compression codes, selected according to Appendix V. Correspondingly, 192 characters receive 12 bit compression codes, while the remaining 52 characters are encoded with eight bits.

In order to provide for decompression, basically all that is required is to maintain a parallel decoding table T2 at the receiving end, such as in modem 15 in FIG. 1. In order to decompress encoded data being received, the decoding table begins with an identical initial table such as set forth in FIG. 3. Then, the exact same steps as described above for maintaining the encoding table T1 are followed on an item by item basis as for the decoding table T2, with the exception that the item being processed is an encoded character, and the objective is to select and provide the appropriate character of the alphabet as a decoded output.

The method of decompressing data compressed in accordance with the present invention is typically performed at the other end of the communications link. A parallel second alphabet of $n_d$ characters duplicative of the first alphabet is provided, where $n_d$ is the same as the number n of characters in the first alphabet, with the subscripted "d" signifying that the operation is performed at the decoding or decompressing apparatus. The $n_d$ characters of the second alphabet are arranged in an initial ordered array identical to the array of the first alphabet. A sequential data stream encoded with the compression codes is received over the communication link. A character in the alphabet corresponding to the compression code is then looked up. The output provided is a character of the alphabet corresponding to the compression code. Finally, the order of the array for the second alphabet is maintained in the manner as set forth above for the alphabet in the transmitting or encoding modem. Accordingly, as the frequency of occurrence of characters in the input information stream being encoded changes, the more frequently appearing corresponding characters in the second alphabet tend to migrate toward the beginning of the decoding array in parallel with the encoding array.

In the preferred embodiment, this entails usage of an inverse algorithm to the one employed for computing the compression code. The inverse algorithm, which is embodied as a program for the microcomputer at the receiving end, will be described next. Four bit nibbles of data are the minimum packet size; N1 refers to the first nibble received, N2 the second, and N3 the third. Moreover, let the notation N1N2 mean the value 16*N1+N2, for brevity. Then, the steps taken for decoding are as follows:

If N1 is less than a, the current compression level, the output character is the character in the position N1 in the table T2. Otherwise, N1 is saved and the the system awaits the arrival of N2.

If N1N2 is less than 256−a, then the output character is the character in the position (N1N2−15*a) of table T2. Otherwise, N1 and N2 are saved, and the system awaits the arrival of N3.

If a third nibble is received, N1 is discarded (which is always an F), and the character in the position N2N3 is provided as the decompressed output.

Thus, as data is presented for decoding, a character is selected from the decoding table T2 which corresponds to the particular digital code represented by the presented item of data. The selected character in the decoding table T2 is provided as a decoded output. In the same manner as for the encoding table, periodically the spatial relationship of a codes within the array and the characters of the alphabet are adjusted as the function of the frequency of occurrence of the characters, after the characters have been decoded. Accordingly, and in the same manner as for the encoding table, as the frequency of occurrence of the decoded characters over a plurality of characters changes, the more frequently occurring characters become associated with the shorter codes in parallel with the codes in the encoding table.

It will be appreciated that the same method must be performed by the decoder as is performed by the encoder, and in synchronism, in order for proper operation. In order to ensure synchronized operation, in the preferred embodiment, the following sequence of operations is performed by the encoder and the decoder: (1) a character is encoded according to table T1 and transmitted by a transmitting modem, (2) the transmitting modem updates its table T1, (3) the receiving modem decodes the received character according to its then-current table T2, and (4) the receiving modem updates its table T2.

Additional means are provided for resetting, to ensure that operation by the encoder and decoder begin in synchronism. In the preferred embodiment, one of the seldomused ASCII character codes is employed as a transparent "flag" or "escape" character while provides a plurality of control codes. One of these codes is use for reset. During set-up, the transmitting modem resets its table to a known initial state, and then transmits the reset character. This causes the receiving modem to reset its table T2 to the same initial state as Table T1.

For resetting and for other reasons, it is necessary to send control information from the data compression circuit to the decompression circuit. In the preferred embodiment, control information is send using a "flag" byte; a hexadecimal FA is used in the disclosed embodiment. This byte is injected into the output stream when control functions are necessary. This "flag" byte is always followed by a "flag code" byte, which carries the control information. A "flush" operation, to be described next, must be done before a flag byte is injected.

In the preferred embodiment, three flag codes are provided, although more or fewer could be employed. These three include a "no-op" (no operation) code, a "D-flag" code, and a "reset" code. The "no-op" code is self explanatory; it is used in the flush operation. The "D-flag" is a command to keep the flag byte in the data stream. About one out of every 256 bytes in a typical data stream will by chance be the byte defined as the flag byte. To keep data from being lost, the compression circuit must recognize these bytes and inject a D-flag after each to tell the decompression circuit to leave the flag byte in the data stream. The reset code of course is used to reset the tables to an initial state.

It will of course be understood that the flag byte is optional in the present invention. Having a special flag byte increases the amount of data transmitted by roughly 0.4%, but the functionality it adds is convenient.

The preferred method further comprises steps for obtaining additional compression on occasions when strings of repeated characters occur within the data to be transmitted or stored. Those skilled in the art will understand that redundant data frequently occurs in strings of repeated characters, particularly in the communications of certain types of information files. For example, certain spreadsheet files frequently have imbedded therein strings of null or zero characters representing blank areas in the spreadsheet.

One conventional compression method used for handling strings of repetitive characters comprises the transmission of a "flag" character, signifying the entrance of a repeat state, followed by the character to be repeated, followed by a number indicative of the number of repeated instances of the particular character.

Additional compression is realized in the novel repeat state employed in the preferred embodiment. In this method, a "repeat state" is automatically entered at the encoder and at the decoder after three consecutive occurrences of the same character. Following the three identical characters will always occur a signal or indicium indicative of either a number or a "additional repeat state". Then, no more data is transmitted until the end of the string of repeated characters, or until fifteen more repeated characters have been received, or until a timing signal causes the pending data to be "finished up" when in a streaming mode.

In the preferred method, a four bit "count nibble" is employed to represent the indicium representing the number of occurrences of the repetitive characters. A hexadecimal representation of the four bit nibble may vary between 0 and F. The F represents both fifteen additional characters and the continuation of the repeat state, meaning that an additional count nibble follows the present count nibble.

For example, and referring now to FIG. 17A, it may be seen that an exemplary input data stream includes a string of three repetitive e's. When three repetitive characters have occurred, the repeat state is automatically entered at the encoder and the decoder, and a count nibble indicium is the expected next character. The compressed data stream transmitted therefore comprises three e's followed by a repeat indicium which represents the number of repeats, zero to fifteen, which follow the initial three characters. If the number is fifteen (hexadecimal F), the repeat state continues; otherwise it terminates in the receiver after recreation of the indicated number of repeated characters. In the case of FIG. 17A, there are but three repeated characters in toto, so the repeat indicium is zero.

As another example, refer now to FIG. 17B. After the repeat state is entered, it may be seen that there are three additional e characters subsequent to the initial three e's. Accordingly, the compressed data stream transmitted comprises three e's, followed by a repeat indicium of 3, indicating that three additional e's follow the initial three e's.

Up to fifteen additional characters may be represented by a single repeat indicium or code. Beyond this number, another repeat code is called for. In the preferred method, the hexadecimal character F is an indication that fifteen repeats occur, and that an additional repeat indicium is expected. Note in FIG. 17C that after the repeat state is entered for the first three e characters, there are an additional fifteen e characters. Accordingly, the compressed data stream transmitted is three e's, followed by a repeat indicium of F (which indicates that fifteen additional occurrences of the character e occur), followed by a second repeat indicium of 0. The zero indicates of course that there are no additional occurrences of the repeat character after the string of additional fifteen.

In FIG. 17D, it may be seen that a string of eighteen additional characters follows the initial three characters. This produces a compressed data stream of the initial three e's, followed by a first repeat indicium of F signifying the first fifteen characters and that a second repeat indicium follows, followed by a second repeat indicium of 3, indicative of the final three characters in the stream.

Finally, and referring to FIG. 17E, it should be understood that consecutive occurrences of repeat indicia may be employed for strings as long as may be desired. In the example of FIG. 17E, a string of thirty-two additional characters follows the initial three characters. In the preferred method, this data stream is represented by three e's to trigger the repeat state, a first repeat indicium of F to indicate the first fifteen characters and to signify that an additional repeat indicium follows, a second repeat indicium of F to indicate the next fifteen characters and to signify that an yet another repeat indicium follows, plus a final repeat indicium of two to pick up the final two characters in the total of thirty-two.

It will now be appreciated that the preferred method for compressing an input data stream having a string of m repetitive characters comprises entering a repeat state by detecting the occurrence of a predetermined number n instances of repetitive characters, transmitting data representing the predetermined number n repetitive characters, and immediately thereafter, transmitting a coded first indicium representing a number o of occurrences of the repetitive character subsequent to the n instances. In the preferred method disclosed herein, the sum of n and o will equal m.

It will be understood that the method of decompressing data compressed in accordance with the described method of handling repetitive character strings comprises similar but reverse steps. The steps include (1) detecting a repeat state in received data by detecting the occurrence of the same predetermined number n instances of repetitive characters, (2) providing n decoded characters representing the predetermined number n repetitive characters, (3) following the n repetitive characters, receiving the coded indicium representing the number o of occurrences of the repetitive character subsequent to the n instances, (4) followed by providing o decoded characters subsequent to the n characters. Of course, the sum of n and o will also equal m in the decoder as well as in the encoder.

It will be further understood that in the present invention, the repeat indicium represents a number between zero and a predetermined number p characters, fifteen in the disclosed embodiment. It should also be understood that should there be more than fifteen characters in addition to the first three in the string, an additional coded indicium is employed to signify the presence of additional characters. For example, in the preferred method, in the event that a single coded indicium is insufficient, a plurality of coded indicia are employed to represent the total number of repeat characters. When the coded indicium is fifteen, it is also a signal that an additional four bit count nibble or indicium follows, indicative of an additional number of repeated characters. This number can be again a number between zero and p. As in the example of FIG. 17E, with a total string of thirty-five repeat characters, there is received by the decoder the first three characters representing the entry into the repeat state, a first repeat indicium F representing fifteen characters and indicating that an additional indicium follows, a second repeat indicium of F representing fifteen characters and indicating that still another repeat indicium follows, followed by a repeat indicium of of two, for a total of three repeat indicia.

It should be understood that the preferred method for repetitive character compression just described is also provided in the preferred embodiment as a program for the Z80 microcomputer 30 of FIG. 2.

The preferred embodiment of the present invention also is capable of an improved streaming mode of operation. Since bytes of data can be converted into an odd number of nibbles, there will be occasions where the last character in a string of characters is not completely transmitted because the last nibble is waiting for a second nibble to be added so that a complete byte can be sent. Accordingly, in the preferred embodiment a timer circuit or function is provided. This timer watches the duration of inactive periods and, after a predetermined period of inactivity, say 15 milliseconds, flushes unsent data out of the compression circuit. The timer function is most conveniently implemented using the interrupt driven dedicated timer/counter circuit 33 (FIG. 2).

The method for the flush is as follows. These steps are performed in response to the indication that a predetermined time period of inactivity has occurred. If the system is in the repeat state, the "count nibble" is sent and the repeat state is terminated. Next, if there is an odd nibble of data remaining to be transmitted, it is combined with the nibble hexadecimal F and sent as a complete byte. It should be noted in this regard that F is the only nibble that never stands alone as a single-nibble compression code. To prevent the extraneous F from being interpreted by the receiver/decompressor as the first nibble of a new compression code for a new character, a flag byte is sent immediately. If the flush operation was triggered by the timer, the flag byte is followed by the "no-op" code, indicating the receiver is to take no action other than discard the last F nibble, the flag byte, and the no-op byte. If the flush was due to a reset operation, the flag byte would be followed by the reset code.

While it may appear that the flush operation shows down the data throughput rate since it can add two and a half bytes to the data stream, it should be remembered that it only takes place when the channel is idle for 15 milliseconds. Moreover, transmission of 2.5 bytes of data at 9600 bits per second (synchronous) takes only 2.8 milliseconds.

It will now be understood and appreciated that the disclosed embodiment of the present invention possesses several dynamic characteristics and advantages which make it suitable for a wide variety of compression applications. One such "dynamic" is the usage of a plurality of sets or alphabets of compression codes. In other words, each of the different compression levels, there being fifteen in the preferred embodiment, six of which are shown in Appendices I-VI, represents a different compression encoding scheme. Periodically, after accumulating data statistics, a decision is made as to which of these fifteen sets is best suited for the present data being processed. It will be understood that compression level 0 is best suited for random data (with no compression), while compression level 15, having the most four-bit characters, is best suited for highly regular or repetitive data. Levels 8-9 are believed to be the most suitable for English language text.

Another advantage is the fact that these accumulated data statistics are not static. Only a portion of the prior history of the data already processed is retained when evaluating the statistics. This allows rapid adaptation to changing data types and characteristics, while still retaining the advantages of compression.

Yet another advantage is the flexibility to adapt to increase the compression level, and hence the degree of compression, in response to changing frequencies of occurrence. For example, consider the case where but four characters of a data set are occurring so frequently as to receive four-bit codes. If the nature or type of data changes so that two other characters begin to occur frequently, the compression level will be changed to assign six characters a four-bit compression code.

Still another advantage is the speed of adaptability. Because sort operations conducted with a computer are relatively time-consuming, the present invention employs a partial bubble sort, conducting pair-wise exchanges of character positions within a limited predetermined number of characters from a given character within the memory array used for the tables. This uses fewer computer instructions, and results in a satisfactory overall sort rate suitable for real time applications such as a modem. The tables may not be completely sorted according to descending order of probability at any given time, but the more frequently occurring characters are processed and partially sorted more often, and move up to the top of the array quite rapidly.

Still another advantage is the use of half-bytes for compression codes rather than arbitrary bit lengths. Such an implementation is far easier to implement on commercially available microcomputer circuits, and thereby results in faster operation since variable word lengths need not be dealt with.

Yet another advantage realized in the repetitive character string compression method is the fact that an escape character need not be transmitted or even employed as a repeat character, as in prior art systems wherein one of the set of possible characters must be dedicated for use as a repeat character. This frees up an additional character of the alphabet of characters, which may be important in applications wherein the alphabet of different characters is heavily utilized.

Moreover, since the repeat state is automatically entered after a predetermined number of characters, additional savings in processing time are realized. In some prior art arrangements, processing time must be devoted to determining the number of repeated instances occur in the string; only then is the repeat character and the number of repeats transmitted. In the present invention, the predetermined number of characters is transmitted before entering the repeat state, requiring less processing in order to determined the number of repeats after the initial predetermined number of characters. Accordingly, the data flow is not interrupted as much as in prior art approaches.

Last but not least, another advantage of the present invention is of course the degree of compression realized. Using the preferred method for data compression described above, data compression ratios as low as 0.546 have been realized in test data of text files. It is believed that 30% to 40% reductions are realized with the 1-2-3 nibble compression code method, while an additional file size reduction of 2% to 10% are realized with addition of the repeat character string method.

Finally, it will be understood that the preferred embodiment of the present invention has been disclosed by way of example and that other modifications may occur to those skilled in the art without departing from the scope and the spirit of the appended claims.

APPENDIX I

Compression Level = 1

| IN | OUT | IN | OUT | IN | OUT | IN | OUT | IN | OUT | IN | OUT | IN | OUT | IN | OUT |
|----|-----|----|-----|----|-----|----|-----|----|-----|----|-----|----|-----|----|-----|
| 0  | 0   | 20 | 2F  | 40 | 4F  | 60 | 6F  | 80 | 8F  | A0 | AF  | C0 | CF  | E0 | EF  |
| 1  | 10  | 21 | 30  | 41 | 50  | 61 | 70  | 81 | 90  | A1 | B0  | C1 | D0  | E1 | F0  |
| 2  | 11  | 22 | 31  | 42 | 51  | 62 | 71  | 82 | 91  | A2 | B1  | C2 | D1  | E2 | F1  |
| 3  | 12  | 23 | 32  | 43 | 52  | 63 | 72  | 83 | 92  | A3 | B2  | C3 | D2  | E3 | F2  |
| 4  | 13  | 24 | 33  | 44 | 53  | 64 | 73  | 84 | 93  | A4 | B3  | C4 | D3  | E4 | F3  |
| 5  | 14  | 25 | 34  | 45 | 54  | 65 | 74  | 85 | 94  | A5 | B4  | C5 | D4  | E5 | F4  |

| . | IN | OUT | . | IN | OUT | . | IN | OUT | . | IN | OUT | . | IN | OUT | . | IN | OUT | . | IN | OUT | . | IN | OUT |
|---|----|-----|---|----|-----|---|----|-----|---|----|-----|---|----|-----|---|----|-----|---|----|-----|---|----|-----|
| . | 6 | | 15 | . | 26 | 35 | . | 46 | 55 | . | 66 | 75 | . | 86 | 95 | . | A6 | B5 | . | C6 | D5 | . | E6 | F6 |
| . | 7 | | 16 | . | 27 | 36 | . | 47 | 56 | . | 67 | 76 | . | 87 | 96 | . | A7 | B6 | . | C7 | D6 | . | E7 | F6 |
| . | 8 | | 17 | . | 28 | 37 | . | 48 | 57 | . | 68 | 77 | . | 88 | 97 | . | A8 | B7 | . | C8 | D7 | . | E8 | F7 |
| . | 9 | | 18 | . | 29 | 38 | . | 49 | 58 | . | 69 | 78 | . | 89 | 98 | . | A9 | B8 | . | C9 | D8 | . | E9 | F8 |
| . | A | | 19 | . | 2A | 39 | . | 4A | 59 | . | 6A | 79 | . | 8A | 99 | . | AA | B9 | . | CA | D9 | . | EA | F9 |
| . | B | | 1A | . | 2B | 3A | . | 4B | 5A | . | 6B | 7A | . | 8B | 9A | . | AB | BA | . | CB | DA | . | EB | F4 |
| . | C | | 1B | . | 2C | 3B | . | 4C | 5B | . | 6C | 7B | . | 8C | 9B | . | AC | BB | . | CC | DB | . | EC | FB |
| . | D | | 1C | . | 2D | 3C | . | 4D | 5C | . | 6D | 7C | . | 8D | 9C | . | AD | BC | . | CD | DC | . | ED | FC |
| . | E | | 1D | . | 2E | 3D | . | 4E | 5D | . | 6E | 7D | . | 8E | 9D | . | AE | BD | . | CE | DD | . | EE | FD |
| . | F | | 1E | . | 2F | 3E | . | 4F | 5E | . | 6F | 7E | . | 8F | 9E | . | AF | BE | . | CF | DE | . | EF | FE |
| . | 10 | | 1F | . | 30 | 3F | . | 50 | 5F | . | 70 | 7F | . | 90 | 9F | . | B0 | BF | . | D0 | DF | . | F0 | FF0 |
| . | 11 | | 20 | . | 31 | 40 | . | 51 | 60 | . | 71 | 80 | . | 91 | A0 | . | B1 | C0 | . | D1 | E0 | . | F1 | FF1 |
| . | 12 | | 21 | . | 32 | 41 | . | 52 | 61 | . | 72 | 81 | . | 92 | A1 | . | B2 | C1 | . | D2 | E1 | . | F2 | FF2 |
| . | 13 | | 22 | . | 33 | 42 | . | 53 | 62 | . | 73 | 82 | . | 93 | A2 | . | B3 | C2 | . | D3 | E2 | . | F3 | FF3 |
| . | 14 | | 23 | . | 34 | 43 | . | 54 | 63 | . | 74 | 83 | . | 94 | A3 | . | B4 | C3 | . | D4 | E3 | . | F4 | FF4 |
| . | 15 | | 24 | . | 35 | 44 | . | 55 | 64 | . | 75 | 84 | . | 95 | A4 | . | B5 | C4 | . | D5 | E4 | . | F5 | FF5 |
| . | 16 | | 25 | . | 36 | 45 | . | 56 | 65 | . | 76 | 85 | . | 96 | A5 | . | B6 | C5 | . | D6 | E5 | . | F6 | FF6 |
| . | 17 | | 26 | . | 37 | 46 | . | 57 | 66 | . | 77 | 86 | . | 97 | A6 | . | B7 | C6 | . | D7 | E6 | . | F7 | FF7 |
| . | 18 | | 27 | . | 38 | 47 | . | 58 | 67 | . | 78 | 87 | . | 98 | A7 | . | B8 | C7 | . | D8 | E7 | . | F8 | FF8 |
| . | 19 | | 28 | . | 39 | 48 | . | 59 | 68 | . | 79 | 88 | . | 99 | A8 | . | B9 | C8 | . | D9 | E8 | . | F9 | FF9 |
| . | 1A | | 29 | . | 3A | 49 | . | 5A | 69 | . | 7A | 89 | . | 9A | A9 | . | BA | C9 | . | DA | E9 | . | FA | FFA |
| . | 1B | | 2A | . | 3B | 4A | . | 5B | 6A | . | 7B | 8A | . | 9B | AA | . | BB | CA | . | DB | EA | . | FB | FFB |
| . | 1C | | 2B | . | 3C | 4B | . | 5C | 6B | . | 7C | 8B | . | 9C | AB | . | BC | CB | . | DC | EB | . | FC | FFC |
| . | 1D | | 2C | . | 3D | 4C | . | 5D | 6C | . | 7D | 8C | . | 9D | AC | . | BD | CC | . | DD | EC | . | FD | FFD |
| . | 1E | | 2D | . | 3E | 4D | . | 5E | 6D | . | 7E | 8D | . | 9E | AD | . | BE | CD | . | DE | ED | . | FE | FFE |
| . | 1F | | 2E | . | 3F | 4E | . | 5F | 6E | . | 7F | 8E | . | 9F | AE | . | BF | CE | . | DF | EE | . | FF | FFF |

APPENDIX II

Compression Level = 2

| . | IN | OUT | . | IN | OUT | . | IN | OUT | . | IN | OUT | . | IN | OUT | . | IN | OUT | . | IN | OUT | . | IN | OUT |
|---|----|-----|---|----|-----|---|----|-----|---|----|-----|---|----|-----|---|----|-----|---|----|-----|---|----|-----|
| . | 0 | 0 | . | 20 | 3E | . | 40 | 5E | . | 60 | 7E | . | 80 | 9E | . | A0 | BE | . | C0 | DE | . | E0 | FE0 |
| . | 1 | 1 | . | 21 | 3F | . | 41 | 5F | . | 61 | 7F | . | 81 | 9F | . | A1 | BF | . | C1 | DF | . | E1 | FE1 |
| . | 2 | 20 | . | 22 | 40 | . | 42 | 60 | . | 62 | 80 | . | 82 | A0 | . | A2 | C0 | . | C2 | E0 | . | E2 | FE2 |
| . | 3 | 21 | . | 23 | 41 | . | 43 | 61 | . | 63 | 81 | . | 83 | A1 | . | A3 | C1 | . | C3 | E1 | . | E3 | FE3 |
| . | 4 | 22 | . | 24 | 42 | . | 44 | 62 | . | 64 | 82 | . | 84 | A2 | . | A4 | C2 | . | C4 | E2 | . | E4 | FE4 |
| . | 5 | 23 | . | 25 | 43 | . | 45 | 63 | . | 65 | 83 | . | 85 | A3 | . | A5 | C3 | . | C5 | E3 | . | E5 | FE5 |
| . | 6 | 24 | . | 26 | 44 | . | 46 | 64 | . | 66 | 84 | . | 86 | A4 | . | A6 | C4 | . | C6 | E4 | . | E6 | FE6 |
| . | 7 | 25 | . | 27 | 45 | . | 47 | 65 | . | 67 | 85 | . | 87 | A5 | . | A7 | C5 | . | C7 | E5 | . | E7 | FE7 |
| . | 8 | 26 | . | 28 | 46 | . | 48 | 66 | . | 68 | 86 | . | 88 | A6 | . | A8 | C6 | . | C8 | E6 | . | E8 | FE8 |
| . | 9 | 27 | . | 29 | 47 | . | 49 | 67 | . | 69 | 87 | . | 89 | A7 | . | A9 | C7 | . | C9 | E7 | . | E9 | FE9 |
| . | A | 28 | . | 2A | 48 | . | 4A | 68 | . | 6A | 88 | . | 8A | A8 | . | AA | C8 | . | CA | E8 | . | EA | FEA |
| . | B | 29 | . | 2B | 49 | . | 4B | 69 | . | 6B | 89 | . | 8B | A9 | . | AB | C9 | . | CB | E9 | . | EB | FEB |
| . | C | 2A | . | 2C | 4A | . | 4C | 6A | . | 6C | 8A | . | 8C | AA | . | AC | CA | . | CC | EA | . | EC | FEC |
| . | D | 2B | . | 2D | 4B | . | 4D | 6B | . | 6D | 8B | . | 8D | AB | . | AD | CB | . | CD | EB | . | ED | FED |
| . | E | 2C | . | 2E | 4C | . | 4E | 6C | . | 6E | 8C | . | 8E | AC | . | AE | CC | . | CE | EC | . | EE | FEE |
| . | F | 2D | . | 2F | 4D | . | 4F | 6D | . | 6F | 8D | . | 8F | AD | . | AF | CD | . | CF | ED | . | EF | FEF |
| . | 10 | 2E | . | 30 | 4E | . | 50 | 6E | . | 70 | 8E | . | 90 | AE | . | B0 | CE | . | D0 | EE | . | F0 | FF0 |
| . | 11 | 2F | . | 31 | 4F | . | 51 | 6F | . | 71 | 8F | . | 91 | AF | . | B1 | CF | . | D1 | EF | . | F1 | FF1 |
| . | 12 | 30 | . | 32 | 50 | . | 52 | 70 | . | 72 | 90 | . | 92 | B0 | . | B2 | D0 | . | D2 | F0 | . | F2 | FF2 |
| . | 13 | 31 | . | 33 | 51 | . | 53 | 71 | . | 73 | 91 | . | 93 | B1 | . | B3 | D1 | . | D3 | F1 | . | F3 | FF3 |
| . | 14 | 32 | . | 34 | 52 | . | 54 | 72 | . | 74 | 92 | . | 94 | B2 | . | B4 | D2 | . | D4 | F2 | . | F4 | FF4 |
| . | 15 | 33 | . | 35 | 53 | . | 55 | 73 | . | 75 | 93 | . | 95 | B3 | . | B5 | D3 | . | D5 | F3 | . | F5 | FF5 |
| . | 16 | 34 | . | 36 | 54 | . | 56 | 74 | . | 76 | 94 | . | 96 | B4 | . | B6 | D4 | . | D6 | F4 | . | F6 | FF6 |
| . | 17 | 35 | . | 37 | 55 | . | 57 | 75 | . | 77 | 95 | . | 97 | B5 | . | B7 | D5 | . | D7 | F5 | . | F7 | FF7 |
| . | 18 | 36 | . | 38 | 56 | . | 58 | 76 | . | 78 | 96 | . | 98 | B6 | . | B8 | D6 | . | D8 | F6 | . | F8 | FF8 |
| . | 19 | 37 | . | 39 | 57 | . | 59 | 77 | . | 79 | 97 | . | 99 | B7 | . | B9 | D7 | . | D9 | F7 | . | F9 | FF9 |
| . | 1A | 38 | . | 3A | 58 | . | 5A | 78 | . | 7A | 98 | . | 9A | B8 | . | BA | D8 | . | DA | F8 | . | FA | FFA |

| . 1B | 59 | . 5B | 59 | . 5B | 79 | . 7B | 99 | . 9B | B9 | . BB | D9 | . DB | F9 | . FB | FFB |
| . 1C | 5A | . 5C | 5A | . 5C | 7A | . 7C | 9A | . 9C | BA | . BC | DA | . DC | FA | . FC | FFC |
| . 1D | 5B | . 5D | 5B | . 5D | 7B | . 7D | 9B | . 9D | BB | . BD | DB | . DD | FB | . FD | FFD |
| . 1E | 5C | . 5E | 5C | . 5E | 7C | . 7E | 9C | . 9E | BC | . BE | DC | . DE | FC | . FE | FFE |
| . 1F | 5D | . 5F | 5D | . 5F | 7D | . 7F | 9D | . 9F | BD | . BF | DD | . DF | FD | . FF | FFF |

APPENDIX III

Compression Level = 4

| . IN | OUT | . IN | OUT | . IN | OUT | . IN | OUT | . IN | OUT | . IN | OUT | . IN | OUT | IN | OUT |
|---|---|---|---|---|---|---|---|---|---|---|---|---|---|---|---|
| . 0 | 0 | . 20 | 5C | . 40 | 7C | . 60 | 9C | . 80 | BC | . A0 | DC | . C0 | FC0 | E0 | FE0 |
| . 1 | 1 | . 21 | 5D | . 41 | 7D | . 61 | 9D | . 81 | BD | . A1 | DD | . C1 | FC1 | E1 | FE1 |
| . 2 | 2 | . 22 | 5E | . 42 | 7E | . 62 | 9E | . 82 | BE | . A2 | DE | . C2 | FC2 | E2 | FE2 |
| . 3 | 3 | . 23 | 5F | . 43 | 7F | . 63 | 9F | . 83 | BF | . A3 | DF | . C3 | FC3 | E3 | FE3 |
| . 4 | 40 | . 24 | 60 | . 44 | 80 | . 64 | A0 | . 84 | C0 | . A4 | E0 | . C4 | FC4 | E4 | FE4 |
| . 5 | 41 | . 25 | 61 | . 45 | 81 | . 65 | A1 | . 85 | C1 | . A5 | E1 | . C5 | FC5 | E5 | FE5 |
| . 6 | 42 | . 26 | 62 | . 46 | 82 | . 66 | A2 | . 86 | C2 | . A6 | E2 | . C6 | FC6 | E6 | FE6 |
| . 7 | 43 | . 27 | 63 | . 47 | 83 | . 67 | A3 | . 87 | C3 | . A7 | E3 | . C7 | FC7 | E7 | FE7 |
| . 8 | 44 | . 28 | 64 | . 48 | 84 | . 68 | A4 | . 88 | C4 | . A8 | E4 | . C8 | FC8 | E8 | FE8 |
| . 9 | 45 | . 29 | 65 | . 49 | 85 | . 69 | A5 | . 89 | C5 | . A9 | E5 | . C9 | FC9 | E9 | FE9 |
| . A | 46 | . 2A | 66 | . 4A | 86 | . 6A | A6 | . 8A | C6 | . AA | E6 | . CA | FCA | EA | FEA |
| . B | 47 | . 2B | 67 | . 4B | 87 | . 6B | A7 | . 8B | C7 | . AB | E7 | . CB | FCB | EB | FEB |
| . C | 48 | . 2C | 68 | . 4C | 88 | . 6C | A8 | . 8C | C8 | . AC | E8 | . CC | FCC | EC | FEC |
| . D | 49 | . 2D | 69 | . 4D | 89 | . 6D | A9 | . 8D | C9 | . AD | E9 | . CD | FCD | ED | FED |
| . E | 4A | . 2E | 6A | . 4E | 8A | . 6E | AA | . 8E | CA | . AE | EA | . CE | FCE | EE | FEE |
| . F | 4B | . 2F | 6B | . 4F | 8B | . 6F | AB | . 8F | CB | . AF | EB | . CF | FCF | EF | FEF |
| . 10 | 4C | . 30 | 6C | . 50 | 8C | . 70 | AC | . 90 | CC | . B0 | EC | . D0 | FD0 | F0 | FF0 |
| . 11 | 4D | . 31 | 6D | . 51 | 8D | . 71 | AD | . 91 | CD | . B1 | ED | . D1 | FD1 | F1 | FF1 |
| . 12 | 4E | . 32 | 6E | . 52 | 8E | . 72 | AE | . 92 | CE | . B2 | EE | . D2 | FD2 | F2 | FF2 |
| . 13 | 4F | . 33 | 6F | . 53 | 8F | . 73 | AF | . 93 | CF | . B3 | EF | . D3 | FD3 | F3 | FF3 |
| . 14 | 50 | . 34 | 70 | . 54 | 90 | . 74 | B0 | . 94 | D0 | . B4 | F0 | . D4 | FD4 | F4 | FF4 |
| . 15 | 51 | . 35 | 71 | . 55 | 91 | . 75 | B1 | . 95 | D1 | . B5 | F1 | . D5 | FD5 | F5 | FF5 |
| . 16 | 52 | . 36 | 72 | . 56 | 92 | . 76 | B2 | . 96 | D2 | . B6 | F2 | . D6 | FD6 | F6 | FF6 |
| . 17 | 53 | . 37 | 73 | . 57 | 93 | . 77 | B3 | . 97 | D3 | . B7 | F3 | . D7 | FD7 | F7 | FF7 |
| . 18 | 54 | . 38 | 74 | . 58 | 94 | . 78 | B4 | . 98 | D4 | . B8 | F4 | . D8 | FD8 | F8 | FF8 |
| . 19 | 55 | . 39 | 75 | . 59 | 95 | . 79 | B5 | . 99 | D5 | . B9 | F5 | . D9 | FD9 | F9 | FF9 |
| . 1A | 56 | . 3A | 76 | . 5A | 96 | . 7A | B6 | . 9A | D6 | . BA | F6 | . DA | FDA | FA | FFA |
| . 1B | 57 | . 3B | 77 | . 5B | 97 | . 7B | B7 | . 9B | D7 | . BB | F7 | . DB | FDB | FB | FFB |
| . 1C | 58 | . 3C | 78 | . 5C | 98 | . 7C | B8 | . 9C | D8 | . BC | F8 | . DC | FDC | FC | FFC |
| . 1D | 59 | . 3D | 79 | . 5D | 99 | . 7D | B9 | . 9D | D9 | . BD | F9 | . DD | FDD | FD | FFD |
| . 1E | 5A | . 3E | 7A | . 5E | 9A | . 7E | BA | . 9E | DA | . BE | FA | . DE | FDE | FE | FFE |
| . 1F | 5B | . 3F | 7B | . 5F | 9B | . 7F | BB | . 9F | DB | . BF | FB | . DF | FDF | FF | FFF |

APPENDIX IV

Compression Level = 8

| . IN | OUT | . IN | OUT | . IN | OUT | . IN | OUT | . IN | OUT | . IN | OUT | . IN | OUT | IN | OUT |
|---|---|---|---|---|---|---|---|---|---|---|---|---|---|---|---|
| . 0 | 0 | . 20 | 98 | . 40 | B8 | . 60 | D8 | . 80 | F80 | . A0 | FA0 | . C0 | FC0 | E0 | FE0 |
| . 1 | 1 | . 21 | 99 | . 41 | B9 | . 61 | D9 | . 81 | F81 | . A1 | FA1 | . C1 | FC1 | E1 | FE1 |
| . 2 | 2 | . 22 | 9A | . 42 | BA | . 62 | DA | . 82 | F82 | . A2 | FA2 | . C2 | FC2 | E2 | FE2 |
| . 3 | 3 | . 23 | 9B | . 43 | BB | . 63 | DB | . 83 | F83 | . A3 | FA3 | . C3 | FC3 | E3 | FE3 |
| . 4 | 4 | . 24 | 9C | . 44 | BC | . 64 | DC | . 84 | F84 | . A4 | FA4 | . C4 | FC4 | E4 | FE4 |
| . 5 | 5 | . 25 | 9D | . 45 | BD | . 65 | DD | . 85 | F85 | . A5 | FA5 | . C5 | FC5 | E5 | FE5 |
| . 6 | 6 | . 26 | 9E | . 46 | BE | . 66 | DE | . 86 | F86 | . A6 | FA6 | . C6 | FC6 | E6 | FE6 |
| . 7 | 7 | . 27 | 9F | . 47 | BF | . 67 | DF | . 87 | F87 | . A7 | FA7 | . C7 | FC7 | E7 | FE7 |

|   |    |   |    |    |    |    |    |    |    |    |    |     |    |     |    |     |    |     |    |     |    |
|---|----|---|----|----|----|----|----|----|----|----|----|-----|----|-----|----|-----|----|-----|----|-----|----|
| . | 8  | 80| .23| A0 | .48| C0 | .68| E0 | .88| F88| .A8| FA8 | .C8| FC8 | .E8| FE8 |
| . | 9  | 81| .29| A1 | .49| C1 | .69| E1 | .89| F89| .A9| FA9 | .C9| FC9 | .E9| FE9 |
| . | A  | 82| .2A| A2 | .4A| C2 | .6A| E2 | .8A| F8A| .AA| FAA | .CA| FCA | .EA| FEA |
| . | B  | 83| .2B| A3 | .4B| C3 | .6B| E3 | .8B| F8B| .AB| FAB | .CB| FCB | .EB| FEB |
| . | C  | 84| .2C| A4 | .4C| C4 | .6C| E4 | .8C| F8C| .AC| FAC | .CC| FCC | .EC| FEC |
| . | D  | 85| .2D| A5 | .4D| C5 | .6D| E5 | .8D| F8D| .AD| FAD | .CD| FCD | .ED| FED |
| . | E  | 86| .2E| A6 | .4E| C6 | .6E| E6 | .8E| F8E| .AE| FAE | .CE| FCE | .EE| FEE |
| . | F  | 87| .2F| A7 | .4F| C7 | .6F| E7 | .8F| F8F| .AF| FAF | .CF| FCF | .EF| FEF |
| . | 10 | 88| .30| A8 | .50| C8 | .70| E8 | .90| F90| .B0| FB0 | .D0| FD0 | .F0| FF0 |
| . | 11 | 89| .31| A9 | .51| C9 | .71| E9 | .91| F91| .B1| FB1 | .D1| FD1 | .F1| FF1 |
| . | 12 | 8A| .32| AA | .52| CA | .72| EA | .92| F92| .B2| FB2 | .D2| FD2 | .F2| FF2 |
| . | 13 | 8B| .33| AB | .53| CB | .73| EB | .93| F93| .B3| FB3 | .D3| FD3 | .F3| FF3 |
| . | 14 | 8C| .34| AC | .54| CC | .74| EC | .94| F94| .B4| FB4 | .D4| FD4 | .F4| FF4 |
| . | 15 | 8D| .35| AD | .55| CD | .75| ED | .95| F95| .B5| FB5 | .D5| FD5 | .F5| FF5 |
| . | 16 | 8E| .36| AE | .56| CE | .76| EE | .96| F96| .B6| FB6 | .D6| FD6 | .F6| FF6 |
| . | 17 | 8F| .37| AF | .57| CF | .77| EF | .97| F97| .B7| FB7 | .D7| FD7 | .F7| FF7 |
| . | 18 | 90| .38| B0 | .58| D0 | .78| F0 | .98| F98| .B8| FB8 | .D8| FD8 | .F8| FF8 |
| . | 19 | 91| .39| B1 | .59| D1 | .79| F1 | .99| F99| .B9| FB9 | .D9| FD9 | .F9| FF9 |
| . | 1A | 92| .3A| B2 | .5A| D2 | .7A| F2 | .9A| F9A| .BA| FBA | .DA| FDA | .FA| FFA |
| . | 1B | 93| .3B| B3 | .5B| D3 | .7B| F3 | .9B| F9B| .BB| FBB | .DB| FDB | .FB| FFB |
| . | 1C | 94| .3C| B4 | .5C| D4 | .7C| F4 | .9C| F9C| .BC| FBC | .DC| FDC | .FC| FFC |
| . | 1D | 95| .3D| B5 | .5D| D5 | .7D| F5 | .9D| F9D| .BD| FBD | .DD| FDD | .FD| FFD |
| . | 1E | 96| .3E| B6 | .5E| D6 | .7E| F6 | .9E| F9E| .BE| FBE | .DE| FDE | .FE| FFE |
| . | 1F | 97| .3F| B7 | .5F| D7 | .7F| F7 | .9F| F9F| .BF| FBF | .DF| FDF | .FF| FFF |

APPENDIX V

Compression Level = 12

| IN | OUT | IN | OUT | IN | OUT | IN | OUT | IN | OUT | IN | OUT | IN | OUT | IN | OUT |
|----|-----|----|-----|----|-----|----|-----|----|-----|----|-----|----|-----|----|-----|
| 0  | 0   | 20 | 04  | 40 | F40 | 60 | F60 | 80 | F80 | A0 | FA0 | C0 | FC0 | E0 | FE0 |
| 1  | 1   | 21 | 05  | 41 | F41 | 61 | F61 | 81 | F81 | A1 | FA1 | C1 | FC1 | E1 | FE1 |
| 2  | 2   | 22 | 06  | 42 | F42 | 62 | F62 | 82 | F82 | A2 | FA2 | C2 | FC2 | E2 | FE2 |
| 3  | 3   | 23 | 07  | 43 | F43 | 63 | F63 | 83 | F83 | A3 | FA3 | C3 | FC3 | E3 | FE3 |
| 4  | 4   | 24 | 08  | 44 | F44 | 64 | F64 | 84 | F84 | A4 | FA4 | C4 | FC4 | E4 | FE4 |
| 5  | 5   | 25 | 09  | 45 | F45 | 65 | F65 | 85 | F85 | A5 | FA5 | C5 | FC5 | E5 | FE5 |
| 6  | 6   | 26 | 0A  | 46 | F46 | 66 | F66 | 86 | F86 | A6 | FA6 | C6 | FC6 | E6 | FE6 |
| 7  | 7   | 27 | 0B  | 47 | F47 | 67 | F67 | 87 | F87 | A7 | FA7 | C7 | FC7 | E7 | FE7 |
| 8  | 8   | 28 | 0C  | 48 | F48 | 68 | F68 | 88 | F88 | A8 | FA8 | C8 | FC8 | E8 | FE8 |
| 9  | 9   | 29 | 0D  | 49 | F49 | 69 | F69 | 89 | F89 | A9 | FA9 | C9 | FC9 | E9 | FE9 |
| A  | A   | 2A | 0E  | 4A | F4A | 6A | F6A | 8A | F8A | AA | FAA | CA | FCA | EA | FEA |
| B  | B   | 2B | 0F  | 4B | F4B | 6B | F6B | 8B | F8B | AB | FAB | CB | FCB | EB | FEB |
| C  | C0  | 2C | E0  | 4C | F4C | 6C | F6C | 8C | F8C | AC | FAC | CC | FCC | EC | FEC |
| D  | C1  | 2D | E1  | 4D | F4D | 6D | F6D | 8D | F8D | AD | FAD | CD | FCD | ED | FED |
| E  | C2  | 2E | E2  | 4E | F4E | 6E | F6E | 8E | F8E | AE | FAE | CE | FCE | EE | FEE |
| F  | C3  | 2F | E3  | 4F | F4F | 6F | F6F | 8F | F8F | AF | FAF | CF | FCF | EF | FEF |
| 10 | C4  | 30 | E4  | 50 | F50 | 70 | F70 | 90 | F90 | B0 | FB0 | D0 | FD0 | F0 | FF0 |
| 11 | C5  | 31 | E5  | 51 | F51 | 71 | F71 | 91 | F91 | B1 | FB1 | D1 | FD1 | F1 | FF1 |
| 12 | C6  | 32 | E6  | 52 | F52 | 72 | F72 | 92 | F92 | B2 | FB2 | D2 | FD2 | F2 | FF2 |
| 13 | C7  | 33 | E7  | 53 | F53 | 73 | F73 | 93 | F93 | B3 | FB3 | D3 | FD3 | F3 | FF3 |
| 14 | C8  | 34 | E8  | 54 | F54 | 74 | F74 | 94 | F94 | B4 | FB4 | D4 | FD4 | F4 | FF4 |
| 15 | C9  | 35 | E9  | 55 | F55 | 75 | F75 | 95 | F95 | B5 | FB5 | D5 | FD5 | F5 | FF5 |
| 16 | CA  | 36 | EA  | 56 | F56 | 76 | F76 | 96 | F96 | B6 | FB6 | D6 | FD6 | F6 | FF6 |
| 17 | CB  | 37 | EB  | 57 | F57 | 77 | F77 | 97 | F97 | B7 | FB7 | D7 | FD7 | F7 | FF7 |
| 18 | CC  | 38 | EC  | 58 | F58 | 78 | F78 | 98 | F98 | B8 | FB8 | D8 | FD8 | F8 | FF8 |
| 19 | CD  | 39 | ED  | 59 | F59 | 79 | F79 | 99 | F99 | B9 | FB9 | D9 | FD9 | F9 | FF9 |
| 1A | CE  | 3A | EE  | 5A | F5A | 7A | F7A | 9A | F9A | BA | FBA | DA | FDA | FA | FFA |
| 1B | CF  | 3B | EF  | 5B | F5B | 7B | F7B | 9B | F9B | BB | FBB | DB | FDB | FB | FFB |
| 1C | D0  | 3C | F0  | 5C | F5C | 7C | F7C | 9C | F9C | BC | FBC | DC | FDC | FC | FFC |

| . 1D | D1 | . 3D | F1 | . 5D | F5D | . 7D | F7D | . 9D | F9D | . BD | F9D | . DD | FDD | . FD | FFD |
| . 1E | D2 | . 3E | F2 | . 5E | F5E | . 7E | F7E | . 9E | F9E | . BE | F9E | . DE | FDE | . FE | FFE |
| . 1F | D3 | . 3F | F3 | . 5F | F5F | . 7F | F7F | . 9F | F9F | . BF | F3F | . DF | FDF | . FF | FFF |

APPENDIX VI

Compression Level = 15

| . IN | OUT | . IN | OUT | . IN | OUT | . IN | OUT | . IN | OUT | . IN | OUT | . IN | OUT | . IN | OUT |
|---|---|---|---|---|---|---|---|---|---|---|---|---|---|---|---|
| . 0 | 0 | . 20 | F20 | . 40 | F40 | . 60 | F60 | . 80 | F80 | . A0 | FA0 | . C0 | FC0 | . E0 | FE0 |
| . 1 | 1 | . 21 | F21 | . 41 | F41 | . 61 | F61 | . 81 | F81 | . A1 | FA1 | . C1 | FC1 | . E1 | FE1 |
| . 2 | 2 | . 22 | F22 | . 42 | F42 | . 62 | F62 | . 82 | F82 | . A2 | FA2 | . C2 | FC2 | . E2 | FE2 |
| . 3 | 3 | . 23 | F23 | . 43 | F43 | . 63 | F63 | . 83 | F83 | . A3 | FA3 | . C3 | FC3 | . E3 | FE3 |
| . 4 | 4 | . 24 | F24 | . 44 | F44 | . 64 | F64 | . 84 | F84 | . A4 | FA4 | . C4 | FC4 | . E4 | FE4 |
| . 5 | 5 | . 25 | F25 | . 45 | F45 | . 65 | F65 | . 85 | F85 | . A5 | FA5 | . C5 | FC5 | . E5 | FE5 |
| . 6 | 6 | . 26 | F26 | . 46 | F46 | . 66 | F66 | . 86 | F86 | . A6 | FA6 | . C6 | FC6 | . E6 | FE6 |
| . 7 | 7 | . 27 | F27 | . 47 | F47 | . 67 | F67 | . 87 | F87 | . A7 | FA7 | . C7 | FC7 | . E7 | FE7 |
| . 8 | 8 | . 28 | F28 | . 48 | F48 | . 68 | F68 | . 88 | F88 | . A8 | FA8 | . C8 | FC8 | . E8 | FE8 |
| . 9 | 9 | . 29 | F29 | . 49 | F49 | . 69 | F69 | . 89 | F89 | . A9 | FA9 | . C9 | FC9 | . E9 | FE9 |
| . A | A | . 2A | F2A | . 4A | F4A | . 6A | F6A | . 8A | F8A | . AA | FAA | . CA | FCA | . EA | FEA |
| . B | B | . 2B | F2B | . 4B | F4B | . 6B | F6B | . 8B | F8B | . AB | FAB | . CB | FCB | . EB | FEB |
| . C | C | . 2C | F2C | . 4C | F4C | . 6C | F6C | . 8C | F8C | . AC | FAC | . CC | FCC | . EC | FEC |
| . D | D | . 2D | F2D | . 4D | F4D | . 6D | F6D | . 8D | F8D | . AD | FAD | . CD | FCD | . ED | FED |
| . E | E | . 2E | F2E | . 4E | F4E | . 6E | F6E | . 8E | F8E | . AE | FAE | . CE | FCE | . EE | FEE |
| . F | F0 | . 2F | F2F | . 4F | F4F | . 6F | F6F | . 8F | F8F | . AF | FAF | . CF | FCF | . EF | FEF |
| . 10 | F10 | . 30 | F30 | . 50 | F50 | . 70 | F70 | . 90 | F90 | . B0 | F80 | . D0 | FD0 | . F0 | FF0 |
| . 11 | F11 | . 31 | F31 | . 51 | F51 | . 71 | F71 | . 91 | F91 | . B1 | F81 | . D1 | FD1 | . F1 | FF1 |
| . 12 | F12 | . 32 | F32 | . 52 | F52 | . 72 | F72 | . 92 | F92 | . B2 | F82 | . D2 | FD2 | . F2 | FF2 |
| . 13 | F13 | . 33 | F33 | . 53 | F53 | . 73 | F73 | . 93 | F93 | . B3 | F83 | . D3 | FD3 | . F3 | FF3 |
| . 14 | F14 | . 34 | F34 | . 54 | F54 | . 74 | F74 | . 94 | F94 | . B4 | F84 | . D4 | FD4 | . F4 | FF4 |
| . 15 | F15 | . 35 | F35 | . 55 | F55 | . 75 | F75 | . 95 | F95 | . B5 | F85 | . D5 | FD5 | . F5 | FF5 |
| . 16 | F16 | . 36 | F36 | . 56 | F56 | . 76 | F76 | . 96 | F96 | . B6 | F86 | . D6 | FD6 | . F6 | FF6 |
| . 17 | F17 | . 37 | F37 | . 57 | F57 | . 77 | F77 | . 97 | F97 | . B7 | F87 | . D7 | FD7 | . F7 | FF7 |
| . 18 | F18 | . 38 | F38 | . 58 | F58 | . 78 | F78 | . 98 | F98 | . B8 | F88 | . D8 | FD8 | . F8 | FF8 |
| . 19 | F19 | . 39 | F39 | . 59 | F59 | . 79 | F79 | . 99 | F99 | . B9 | F89 | . D9 | FD9 | . F9 | FF9 |
| . 1A | F1A | . 3A | F3A | . 5A | F5A | . 7A | F7A | . 9A | F9A | . BA | F8A | . DA | FDA | . FA | FFA |
| . 1B | F1B | . 3B | F3B | . 5B | F5B | . 7B | F7B | . 9B | F9B | . BB | F8B | . DB | FDB | . FB | FFB |
| . 1C | F1C | . 3C | F3C | . 5C | F5C | . 7C | F7C | . 9C | F9C | . BC | F8C | . DC | FDC | . FC | FFC |
| . 1D | F1D | . 3D | F3D | . 5D | F5D | . 7D | F7D | . 9D | F9D | . BD | F8D | . DD | FDD | . FD | FFD |
| . 1E | F1E | . 3E | F3E | . 5E | F5E | . 7E | F7E | . 9E | F9E | . BE | F8E | . DE | FDE | . FE | FFE |
| . 1F | F1F | . 3F | F3F | . 5F | F5F | . 7F | F7F | . 9F | F9F | . BF | F3F | . DF | FDF | . FF | FFF |

What is claimed is:

1. A dynamic data compression method, comprising the steps (1) providing an encoding table having a plurality of sets of digital codes of varying lengths associated with characters of an alphabet, some of the digital codes being shorter than others, the digital codes being of the same length in a given set but of a different length between sets, said encoding table comprising an initial ordered array of the characters in the alphabet and their corresponding digital codes, with a set of shorter codes toward the beginning of the array and a set of longer codes toward the end of the array;

(2) presenting for encoding an item of data represented by one of the characters of the alphabet;

(3) in response to the presented item of data, selecting a code from one of the sets in the encoding table which corresponds to the particular character of the alphabet represented by the presented item of data;

(4) providing the selected code as an output; and (5) periodically adjusting the corresponding relationship of the codes, the characters of the alphabet, and the sizes of the sets of digital codes in the encoding table as a function of the frequency of occurrence of characters of the alphabet over a plurality of characters presented for encoding, whereby as the frequency of occurrence of characters over a plurality of characters presented for encoding changes, the more frequently occurring characters become associated with shorter codes in the encoding table.

2. The method of claim 1, wherein the step of periodically adjusting the corresponding relationship of the codes and the characters of the alphabet in the encoding table comprises the steps of:
   (6) maintaining a character count associated with each character of the alphabet;
   (7) incrementing the particular character count associated with the particular character represented by an item of data presented for encoding after selecting a code from the encoding table;
   (8) after incrementing the character count, comparing the particular character count to character count for a preselected character at a position in the array more likely to be associated with a shorter code; and
   (9) if the particular character count is greater than the character count for the preselected character, exchanging the relative positions in the array of the character just encoded with the preselected character so as to associate the character having the larger character count with a position in the array more likely to be associated with a shorter code.

3. The method of claim 2, wherein the preselected character is positioned a predetermined number of positions in the array toward the beginning of the array from the particular character.

4. The method of claim 3, wherein the predetermined number of positions is sixteen.

5. The method of claim 1, wherein the step of periodically adjusting the sizes of the sets comprises the steps of:
   (1) summing the character counts for predetermined groups of consecutive characters to obtain a plurality of group counts;
   (2) comparing the group count for groups towards the end of the array with the character counts for characters towards the beginning of the array;
   (3) increasing the size of the set of the shortest digital codes until there is a correspondence between a group count and a character count at the end of the set of shortest digital codes,
whereby the size of the set of the shortest digital codes is increased to include more characters having a higher probability of occurrence than any the characters in the set of codes associated with the group counts.

6. The method of claim 5, wherein there are at least three sets of digital codes, and wherein the set associated with the longest digital codes increases in size in increments of the size of the groups while the set associated with the shortest codes increases in size in increments of a single character.

7. The method of claim 6, wherein the set associated with the shortest digital codes varies in size between 0 and 15.

8. The method of claim 6, wherein the set associated with the longest digital codes varies in size between 0 and 240.

9. The method of claim 6, wherein the shortest digital code is 4 bits, and the longest digital code is 12 bits.

10. The method of claim 6, wherein the set associated with the shortest digital code initially has 4 members and the set associated with the longest digital code initially has 64 members.

11. The method of claim 5, wherein the step of periodically adjusting the sizes of the sets is repeated after the occurrence of a predetermined number of items of data presented for encoding.

12. The method of claim 11, wherein the predetermined number of items between adjustments to the size of the sets is 128.

13. The method of claim 5, wherein the predetermined groups of consecutive characters have sixteen characters.

14. The method of claim 1, wherein the step of periodically adjusting the sizes of the sets is taken after every k items of data presented for encoding.

15. The method of claim 14, where k is 128.

16. The method of claim 1, wherein there are n characters in the alphabet, wherein the set associated with the shortest digital code has a members, and the set associated with the longest digital code has c members, and wherein the step of periodically adjusting the sizes of the sets comprises changing the relative values of the numbers a and c by taking the following steps:
   (i) summing the character counts for consecutive groups of m characters to obtain a plurality of n/m group counts;
   (ii) comparing the group count for group $(n/m)-i-1$ to the character count for character j, where i is an integer index of group counts beginning at zero and j is an integer index into the array beginning at zero at the top of the array;
   (iii) if the group count for group $(n/m)-i-1$ is less than the character count for character j, then, incrementing i and j and going back to the step (ii);
   (iv) if the group count for group $(n/m)-i-1$ is greater than or equal to the character count for character j, then establishing an encoding level of $a=j+1$ by assigning $j+1$ of the shortest digital codes, and $c=(n/m) \times (i+1)$ of the longer digital codes.

17. The method of claim 16, wherein there is a set of characters having digital codes sized in between the shortest digital code and the longest digital code and having b members, and wherein $b=n-(j+1)-((n/m)\times(i+1))$.

18. A data decompression method, comprising the steps of:
   (1) providing a decoding table having a plurality of sets of digital codes associated with the characters of an alphabet, the digital codes being of the same length in a given set but of a different length between sets, some of the digital codes being shorter than others, said decoding table comprising an initial ordered array of the characters in the alphabet and their corresponding digital codes, with a set of shorter codes toward the beginning of the array and a set of longer codes toward the end of the array;
   (2) presenting for decoding an item of coded data represented by one of the digital codes;
   (3) in response to the presented item of coded data, selecting a character from one of the sets in the decoding table which corresponds to the particular digital code represented by the presented item of coded data;
   (4) providing the selected character as a decoded output; and
   (5) periodically adjusting the corresponding relationship of the codes, the characters of the alphabet, and the sizes of the sets of digital codes in the decoding table as a function of the frequency of occurrence of characters of the alphabet over a plurality of characters resultant from decoding, whereby as the frequency of occurrence of characters over a plurality of characters resultant from decoding changes, the more frequently occurring characters become associated with shorter codes in the decoding table.

19. A dynamic data compression apparatus, comprising:
  memory means for storing an encoding table comprising a plurality of sets of digital codes associated with characters of an alphabet, some of the digital codes being shorter than others, the digital codes being of the same length in a given set but of a different length between sets, said encoding table comprising an initial ordered array of the characters in the alphabet and their corresponding digital codes, with a set of shorter codes toward a beginning of the array and a set of longer codes toward the end of the array;
  means for receiving for encoding an item of data represented by one of the characters of the alphabet;
  means responsive to the presented item of data for selecting a code from one of the sets in the encoding table in said memory means which corresponds to the particular character of the alphabet represented by the presented item of data;
  output means for providing the selected code as an output; and
  code/character relationship adjusting means for periodically adjusting the corresponding relationship of the codes, the characters of the alphabet, and the sizes of the sets of digital codes in the encoding table in said memory means as a function of the frequency of occurrence of characters of the alphabet over a plurality of characters presented for encoding, whereby as the frequency of occurrence of characters over a plurality of characters presented for encoding changes, the more frequently occurring characters become associated with shorter codes in the encoding table.

20. The apparatus of claim 19, wherein said adjusting means comprises:
  means for maintaining a character count associated with each character of the alphabet in said memory means;
  means for incrementing the particular character count associated with the particular character represented by an item of data presented for encoding after selecting a code from the encoding table;
  means for comparing the particular character count to the character count for a preselected character at a position in the array more likely to be associated with a shorter code after incrementing the character count; and
  means responsive to the particular character count being greater than the character count for the preselected character for exchanging the relative positions in the array of the character just encoded with the preselected character so as to associate the character having the larger character count with a position in the array more likely to be associated with a shorter code.

21. The apparatus of claim 20, wherein the preselected character is positioned a predetermined number of memory locations in the array toward the beginning of the array from the particular character.

22. The apparatus of claim 21, wherein the predetermined number of memory locations is sixteen.

23. The apparatus of claim 19, wherein said set size adjusting means comprises:
  means for summing the character counts for predetermined groups of consecutive characters to obtain a plurality of group counts;
  means for comparing the group count for groups towards the end of the array with the character counts for characters towards the beginning of the array;
  means for increasing the size of the set of the shortest digital codes until there is a correspondence between a group count and a character count at the end of the set of shortest digital codes, whereby the size of the set of the shortest digital codes is increased to include more characters having a higher probability of occurrence than any the characters in the set of codes associated with the group counts.

24. The apparatus of claim 23, wherein there are at least three sets of digital codes, and wherein the set associated with the longest digital codes increases in size in increments of the size of the groups, while the set associated with the shortest codes increases in size in increments of a single character.

25. The apparatus of claim 24, wherein the set associated with the shortest digital codes varies in size between 0 and 15.

26. The apparatus of claim 24, wherein the set associated with the longest digital codes varies in size between 0 and 240.

27. The apparatus of claim 24, wherein the shortest digital code is 4 bits, and the longest digital code is 12 bits.

28. The apparatus of claim 24, wherein the set associated with the shortest digital code initially has 4 members and the set associated with the longest digital code initially has 64 members.

29. The apparatus of claim 23, wherein said set size adjusting means is operative after the occurrence of a predetermined number of items of data presented for encoding.

30. The apparatus of claim 29, wherein the predetermined number of items between adjustments to the size of the sets is 128.

31. The apparatus of claim 23, wherein the predetermined groups of consecutive characters have sixteen characters.

32. The apparatus of claim 19, wherein said set size adjusting means is operative after every k items of data presented for encoding.

33. The method of claim 32, where k is 128.

34. The method of claim 19, wherein there are n characters in the alphabet, wherein the set associated with the shortest digital code has a members, and the set associated with the longest digital code has c members, and wherein said set size adjusting means changes the relative values of the numbers a and c and comprises:
  means for summing the character counts for consecutive groups of m characters to obtain a plurality of n/m group counts;
  means for comparing the group count for group $(n/m)-i-1$ to the character count for character j, where i is an integer index of group counts beginning at zero and j is an integer index into the array beginning at zero at the top of the array;
  means for incrementing i and j if the group count for group (n/m)−i−1 is less than the character count for character j and returning control to said comparing means;

means for assigning a=j+1 of the shortest digital codes and c=(n/m)×(i+1) of the longer digital codes, if the group count for group (n/m)−i−1 is greater than or equal to the character count for character j.

35. The apparatus of claim 34, wherein there is a set of characters having digital codes sized in between the shortest digital code and the longest digital code having b members, and wherein b=n−(j+1)−((n/m)×(i+1)).

36. The apparatus of claim 19, wherein said apparatus is employed in a modem.

37. The apparatus of claim 19, wherein said data receiving means, said code selecting means, said output means, and said code/character relationship adjusting means comprises a programmed microcomputer.

38. A data decompression apparatus, comprising:

memory means for storing a decoding table having a plurality of sets of digital codes associated with the characters of an alphabet, some of the digital codes being shorter than others, the digital codes being of the same length in a given set but of a different length between sets, said decoding table comprising an initial ordered array of the characters in the alphabet and their corresponding digital codes, with a set of shorter codes toward the beginning of the array and a set of longer codes toward the end of the array;

means for receiving for decoding an item of coded data represented by one of the digital codes;

means responsive to the presented item of coded data for selecting a character from one of the sets in the decoding table in said memory means which corresponds to the particular digital code represented by the presented item of coded data;

means for providing the selected character as a decoded output; and means for periodically adjusting the corresponding relationship of the codes, the characters of the alphabet, and the sizes of the sets of digital codes in the decoding table in said memory means as a function of the frequency of occurrence of characters of the alphabet over a plurality of characters resultant from decoding, whereby as the frequency of occurrence of characters over a plurality of characters resultant from decoding changes, the more frequencyl occurring characters become associated with shorter codes in the decoding table.

39. A dynamically variable data compression method, particularly useful in a series/sequential data transmission application such as a modem, comprising the steps of:

(1) providing an alphabet of n characters to be employed in representing information, ranging from 0 to n;

(2) arranging the n characters in an initial ordered array;

(3) providing a set of z bit codes to be used for encoding said n characters, some of said codes having greater bit lengths than others, with shorter codes being associated with positions in the array toward the beginning and longer codes being associated with positions in the array toward the end;

(4) providing a sequential input information stream represented by the characters of said alphabet to be encoded with said codes;

(5) for each item x of said sequential input information stream taking the following steps:

(i) providing a z bit code as an output chosen from said set of codes as a function of the relative position in the array of the character corresponding to the item x;

(ii) incrementing a character count CC associated with the character of said alphabet which represents said particular item x of said sequential input information stream;

(iii) comparing the character count CC with the character count associated with each character within a predetermined range toward the beginning of the array;

(iv) when the character count CC is found upon comparison to be greater than or equal to the character count for a character toward the beginning of the array within said predetermined range, exchanging the relative positions in the array of the character corresponding to the item x and the character toward the beginning of the array within said predetermined range having the equal or lesser character count, whereby as the frequency of occurrence of characters in the input information stream changes, the more frequently appearing characters tend to migrate toward the beginning of the array and thereby become associated with shorter ones of said codes.

40. The method of claim 39, wherein a first predetermined number a of characters in the alphabet are associated with a first code, wherein a second predetermined number b of characters in the alphabet are associated with a second code, the first code being shorter than the second code, and further comprising the step of adjusting the relative values of a and b as a function of the frequency of occurrence of characters in the input information stream.

41. The method of claim 39, wherein z is at least four.

42. The method of claim 39, wherein z is selected from the group consisting of four, eight, and twelve.

43. A dynamic data decompression method, particularly useful in a series/sequential data receiving application such as a modem, comprising the steps of:

(1) providing an alphabet of $n_d$ characters to be employed in representing information, ranging from 0 to $n_d$;

(2) arranging the $n_d$ characters in an initial ordered array, each of the characters being associated with a z bit code used for decoding the characters, some of the codes having greater bit lengths than others, with shorter codes being associated with positions in the array toward the beginning and longer codes being associated with positions in the array toward the end;

(3) receiving a sequential data stream encoded with the codes;

(4) looking up a character in the alphabet corresponding to the code;

(5) providing as an output a character of the alphabet corresponding to the code;

(6) maintaining the order of the array for the alphabet by taking the following steps for each item x of the sequential data stream:

(i) incrementing a character count CC associated with the character of the alphabet which represents said item x of the output character, (ii) comparing the character count CC with the character count associated with each character within a predetermined range toward the beginning the array;

(iii) when the character count CC is found upon comparison to be greater than or equal to the character count for a character toward the begnning of the array within said predetermined range, exchanging the relative positions in the array of the character corresponding to the item x and the character toward the beginning of the array within said predetermined range having the equal or lesser character count, whereby as the frequency of occurrence of characters being output changes, the more frequently appearing corresponding characters in the alphabet tend to migrate toward the beginning of the decoding array.

44. A dynamically variable data compression method, particularly useful in a series/sequential data transmission application such as a modem, comprising the steps of:

(1) providing an alphabet of n characters to be employed in representing information, ranging from 0 to n;

(2) arranging the n characters in an initial ordered array;

(3) providing a first set of p-bit codes to be used for encoding a first predetermined number a of said n characters, a second set of q-bit codes to be used for encoding a second predetermined number b of said n characters, and a third set of r-bit codes to be used for encoding a third predetermined number of c of said n characters, where $a+b+c=n$;

(4) providing a sequential input information stream represented by the characters of said alphabet to be encoded with said p-, said q-, or said r-bit codes;

(5) for each item x of said sequential input information stream, taking the following steps:

(i) providing a z bit code as an output chosen from said first or said second or said third set of codes as a function of the relative position in the array of the character corresponding to the item x, where z is p or q or r;

(ii) incrementing a character count CC associated with the character of said alphabet which represents said particular item x of said sequential input information stream;

(iii) comparing the character count CC with the character count associated with each character within a predetermined range lower in the array, up to a total of d places lower in the array, where d is a predetermined number less than n;

(iv) when the character count CC is found upon comparison to be greater than or equal to the character count for a character lower in the array within said predetermined range, exchanging the relative positions in the array of the character corresponding to the item x and the character lower in the array within said predetermined range having the equal or lesser character count;

(6) after every k characters of said sequential input information stream, changing the "encoding level" represented by the relative values of the numbers a, b, and c by taking the following steps:

(i) summing the character counts for consecutive groups of m characters to obtain a plurality of n/m group counts;

(ii) comparing the group count for group (n/m)-i−1 to the character count for character j, where i is an integer index of group counts beginning at zero and j is an integer index into the array beginning at zero at the top of the array;

(iii) if the group count for group (n/m)−1 is less than the character count for character j, then, incrementing i and j and going back to the step 6(ii);

(iv) if the group count for group (n/m)-i−1 is greater than or equal to the character count for character j, then establishing an encoding level of $a=j+1$ by assigning $j+1$ character codes having p bits, $c=(n/m)\times(i+1)$ character codes having r bits, and $b=n-(j+1)-((n/m)\times(i+1))$ character codes having q bits.

45. The method of claim 44, wherein the alphabet is the ASCII character set, and n is 256.

46. The method of claim 44, wherein $p<q<r$.

47. The method of claim 46, wherein p is 4, q is 8, and r is 12.

48. The method of claim 44, wherein upon initialization, a is 4, b is 188, and c is 64.

49. The method of claim 44, wherein d is 16.

50. The method of claim 44, wherein k is 128.

51. The method of claim 44, wherein m is 16.

52. A dynamically variable data decompression method, particularly useful in a series/sequential data communications device such as a modem, comprising the steps of:

(1) providing an alphabet of $n_d$ characters;

(2) arranging the $n_d$ characters of the alphabet in an initial ordered array;

(3) providing a first set of $p_d$-bit codes to be used for decoding a first predetermined number $a_d$ of said $n_d$ characters, a second set of $q_d$-bit codes to be used for decoding a second predetermined number $b_d$ of said $n_d$ characters, and a third set of $r_d$-bit codes to be used for decoding a third predetermined number $c_d$ of said $n_d$ characters, where $p_d<q_d<r_d$, and where $a_d+b_d+c_d=n_d$;

(4) receiving a sequential data stream over a communications link encoded as a z bit code of p-, q-, and r-bit codes, where p, q, and r correspond to $p_d$, $q_d$, and $r_d$;

(5) for each item x of said sequential data stream, taking the following steps:

(i) finding a match between the z bit code representing the item x and one of said codes associated with said alphabet of $n_d$ characters;

(ii) providing as a decompressed output a character of said alphabet of $n_d$ characters which corresponds to the code representing the item x;

(iii) incrementing a character count $CC_d$ associated with the character of said alphabet which represents the output character corresponding to the particular item x of the sequential data stream;

(iv) comparing the character count $CC_d$ with the character count associated with each character within a predetermined range toward the beginning of the array of said alphabet, up to a total of $d_d$ places toward the beginning of the array; and (v) when the character count $CC_d$ is found upon comparison to be greater than or equal to the character count for a character toward the beginning of the array of said alphabet within said predetermined range, exchanging the relative positions in the array of the character corresponding to the item x and the character toward the beginning of the array within said predetermined range having the equal or lesser character count; and (6) after every $k_d$ characters of said sequential data stream, changing the "decoding level" represented by the relative values of the numbers $a_d$, $b_d$, and $c_d$ by taking the following steps:

(i) summing the character counts for consecutive groups of $m_d$ characters to obtain a plurality of $n_d/m_d$ group counts;

(ii) comparing the group count for group $(n_d/m_d)-i-1$ to the character count for character j, where i is an integer index of group counts beginning at zero and j is an integer index into the array beginning at zero at the beginning of the array;

(iii) if the group count for group $(n_d/m_d)-i-1$ is less than the character count for character j, then, incrementing i and j and going back to the step (6)(ii); and (iv) if the group count for group $(n_d/m_d)-i-1$ is greater than or equal to the character count for character j, then establishing a decoding level of $a_d=j+1$ by assigning $j+1$ character codes having $p_d$ bits, $c_d=(n_d/m_d)\times(i+1)$ character codes having $r_d$ bits, and $b_d=n_d-(j+1)-((n_d/m_d)\times(i+1))$ character codes having $q_d$ bits.

53. A dynamically adjusting data compression method, comprising the steps of:

(1) providing an encoding table having a plurality of sets of digital codes associated with characters of an alphabet, the digital codes being of the same length in a given set but of a different length between sets, the table being arranged in an initial ordered array of increasing code lengths;

(2) presenting for encoding an item of data represented by one of the characters of the alphabet;

(3) in response to the presented item of data, selecting a code from one of the sets in the the encoding table which corresponds to the particular character of the alphabet represented by the presented item of data;

(4) providing the selected code as an output;

(5) in further response to the presented item of data, maintaining a statistical record of the probability of occurrence of the character representing the presented item of data;

(6) in further response to the presented item of data, exchanging the position in the array of the character representing the presented item of data with a character having a lower probability of occurrence such that a character having a higher probability of occurrence will move to a position in the array more likely to be associated with a shorter code; and (7) periodically adjusting the sizes of the sets of digital codes a function of the probability of occurrence of the characters associated with the sets.

54. A dynamically adjusting data decompression method, comprising the steps of:

(1) providing a decoding table having a plurality of sets of digital codes associated with characters of the alphabet, the digital codes being of the same length in a given set but of a different length between sets, the table being arranged in an initial ordered array of increasing code lengths;

(2) presenting for decoding an item of coded data represented by one of the digital codes;

(3) in response to the presented item of coded data, selecting a character from one of the sets in the decoding table which corresponds to the particular digital code represented by the item of coded data;

(4) providing the selected character as a decoded output;

(5) in further response to the presented item of coded data, maintaining a statistical record of the probability of occurrence of the character resultant from decoding;

(6) in further response to the presented item of coded data, exchanging the position in the decoding array of the decoded character with a character having a lower probability of occurrence such that a character having a higher probability of occurrence will move to a position in the array more likely to be associated with a shorter code; and (7) periodically adjusting the sizes of the sets as a function of the probability of occurrence of the characters associated with the sets.

55. A dynamic data compression method, comprising the steps of:

(1) providing an encoding table having a plurality of sets of digital codes associated with characters of an alphabet, the digital codes being of different lengths between sets;

(2) presenting for encoding an item of data represented by one of the characters of the alphabet;

(3) in response to the presented item of data, selecting a code from one of the sets in the encoding table which corresponds to the particular character of the alphabet represented by the presented item of data;

(4) providing the selected code as an output; and (5) periodically adjusting the sizes of the sets of digital codes in the encoding table as a function of the frequency of occurrence of characters of the alphabet over a plurality of characters presented for encoding, whereby the numbers of characters represented by different digital codes varies as a function of the frequency of occurrence of characters in the data presented for encoding.

56. The method of claim 55, wherein the step of periodically adjusting the sizes of the sets comprises the steps of:

(1) summing character counts for predetermined groups of consecutive characters to obtain a plurality of group counts;

(2) comparing the group count for groups towards the end of the array with the character counts for characters towards the beginning of the array;

(3) increasing the size of the set of the shortest digital codes until there is a correspondence between a group count and a character count at the end of the set of shortest digital codes, whereby the size of the set of the shortest digital codes is increased to include more characters having a higher probability of occurrence than any the characters in the set of codes associated with the group counts.

57. The method of claim 56, wherein there are at least three sets of digital codes, and wherein the set associated with the longest digital codes increases in size in increments of the size of the groups while the set associated with the shortest codes increases in size in increments of a single character.

58. The method of claim 55, wherein the step of periodically adjusting the sizes of the sets is repeated after the occurrence of a predetermined number of items of data presented for encoding.

59. The method of claim 58, wherein the predetermined number of items between adjustments to the size of the sets is 128.

60. The method of claim 55, wherein there are n characters in the alphabet, wherein a first set associated with the shortest digital code has a members, and a second set associated with the longest digital code has c members, and wherein the step of periodically adjusting the sizes of the sets comprises changing the relative values of the numbers a and c by taking the following steps:
   (i) summing character counts for consecutive groups of m characters to obtain a plurality of n/m group counts, said character counts corresponding to frequency of occurrence statistics accumulated over a plurality of characters processed with the method;
   (ii) comparing the group count for group (n/m)-i−1 to the character count for character j, where i is an integer index of group counts beginning at zero and j is an integer index into the array beginning at zero at the top of the array;
   (iii) if the group count for group (n/m)-i−1 is less than the character count for character j, then, incrementing i and j and going back to the step (ii);
   (iv) if the group count for group (n/m)-i−1 is greater than or equal to the character count for character j, then establishing an encoding level of a=j+1 by assigning j+1 of the shortest digital codes, and c=(n/m)×(i+1) of the longer digital codes.

61. The method of claim 60, wherein there is a set of characters having digital codes sized in between the shortest digital code and the longest digital code and having b members, and wherein b=n-(j+1)-((n/m)×(i+1)).

62. A dynamic data compression method, comprising the steps of:
   (1) providing an encoding table having a plurality of digital codes of varying lengths associated with characters of an alphabet, said encoding table comprising an initial ordered array of the characters in the alphabet and their corresponding digital codes, with shorter codes toward the beginning of the array and longer codes toward the end of the array;
   (2) presenting for encoding an item of data represented by one of the characters of the alphabet;
   (3) in resoponse to the presented item of data, selecting a code from one of the sets in the encoding table which corresponds to the particular character of the alphabet represented by the presented item of data;
   (4) providing the selected code as an output;
   (5) in further response to the presented item of data, incrementing a character count corresponding to the frequency of occurrence of the particular character of the alphabet represented by the presented item of data;
   (6) in further response to the presented item of data, after incrementing the particular character's character count, comparing the particular character's character count to a character count for a preselected character in the array within a predetermined number of positions toward the beginning of the array; and
   (7) if the particular character's character count is greater than the character count for the preselected character, exchanging the relative positions in the array of the character just encoded with the preselected character so as to associate the character having the larger character count with a position in the array more likely to be associated with a shorter code, whereby as the frequency of occurrence of characters over a plurality of characters presented for encoding changes, the more frequently occurring characters become associated with shorter codes in the encoding table.

63. The method of claim 62, wherein the predetermined number of positions is sixteen.

* * * * *